(12) United States Patent
Najafi et al.

(10) Patent No.: US 11,678,578 B2
(45) Date of Patent: Jun. 13, 2023

(54) THERMOELECTRIC MICRO-MODULE WITH HIGH LEG DENSITY FOR ENERGY HARVESTING AND COOLING APPLICATIONS

(71) Applicant: THE REGENTS OF THE UNIVERSITY OF MICHIGAN, Ann Arbor, MI (US)

(72) Inventors: Khalil Najafi, Ann Arbor, MI (US); Yi Yuan, Ann Arbor, MI (US); Ethem Aktakka, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 74 days.

(21) Appl. No.: 17/164,002

(22) Filed: Feb. 1, 2021

(65) Prior Publication Data
US 2021/0159381 A1 May 27, 2021

Related U.S. Application Data

(62) Division of application No. 16/071,029, filed as application No. PCT/US2017/014087 on Jan. 19, 2017, now abandoned.
(Continued)

(51) Int. Cl.
*H10N 10/17* (2023.01)
*H10N 10/01* (2023.01)
(Continued)

(52) U.S. Cl.
CPC ............ *H10N 10/17* (2023.02); *H10N 10/01* (2023.02); *H10N 10/852* (2023.02);
(Continued)

(58) Field of Classification Search
None
See application file for complete search history.

(56) References Cited

U.S. PATENT DOCUMENTS

| 6,121,539 A * | 9/2000 | Johnson .................. H01L 23/38 |
| | | 136/203 |
| 6,388,185 B1 | 5/2002 | Fleurial et al. |

(Continued)

FOREIGN PATENT DOCUMENTS

| JP | 2004281666 A | 10/2004 |
| WO | WO-2014-145293 A2 | 9/2014 |

OTHER PUBLICATIONS

International Search Report and Written Opinion of the Searching Authority issued in PCT/US2017/014087, dated Apr. 24, 2017; ISA/KR.

*Primary Examiner* — Scott B Geyer
(74) *Attorney, Agent, or Firm* — Harness, Dickey & Pierce, P.L.C.

(57) ABSTRACT

Micro-scale thermoelectric devices having high thermal resistance and efficiency for use in cooling and energy harvesting applications and relating fabricating methods are disclosed. The thermoelectric devices include first substrates substantially parallel with second substrates. Scaffold members are deposited between the first and second substrate. The scaffold members include a plurality of cavities having sidewalls. The scaffold members may be formed from the second substrate. The sidewalls are substantially vertical with respect to the second substrate. The sidewalls may be substantially parallel. Thermoelectric materials are deposited on the sidewalls.

21 Claims, 19 Drawing Sheets

Related U.S. Application Data

(60) Provisional application No. 62/280,274, filed on Jan. 19, 2016.

(51) Int. Cl.
  *H10N 10/852* (2023.01)
  *H10N 10/853* (2023.01)
  *H10N 10/855* (2023.01)
  *H10N 19/00* (2023.01)

(52) U.S. Cl.
  CPC ......... *H10N 10/853* (2023.02); *H10N 10/855* (2023.02); *H10N 19/101* (2023.02)

(56) References Cited

U.S. PATENT DOCUMENTS

| | | | |
|---|---|---|---|
| 7,164,077 B2 | 1/2007 | Venkatasubramanian | |
| 7,723,606 B2 | 5/2010 | Fiorini et al. | |
| 9,062,582 B2 * | 6/2015 | Loman | F01N 3/18 |
| 2002/0046762 A1 * | 4/2002 | Rossi | H01L 35/18 |
| | | | 136/238 |
| 2006/0151021 A1 | 7/2006 | Stark | |
| 2007/0221264 A1 * | 9/2007 | Shutoh | H01L 35/32 |
| | | | 136/224 |
| 2008/0017237 A1 * | 1/2008 | Bray | H01L 35/26 |
| | | | 136/224 |
| 2009/0126771 A1 * | 5/2009 | Takahashi | H01L 35/06 |
| | | | 136/203 |
| 2011/0241153 A1 | 10/2011 | McCann | |
| 2012/0297755 A1 | 11/2012 | Adldinger et al. | |
| 2013/0061605 A1 * | 3/2013 | de Rochemont | H01L 35/18 |
| | | | 438/22 |
| 2014/0099539 A1 * | 4/2014 | Yamazaki | H01M 4/366 |
| | | | 423/325 |
| 2014/0230873 A1 | 8/2014 | Kirihara et al. | |
| 2014/0360549 A1 | 12/2014 | Wang et al. | |
| 2015/0048249 A1 * | 2/2015 | Hedler | H01L 35/32 |
| | | | 250/338.4 |
| 2015/0325772 A1 * | 11/2015 | Boukai | H01L 35/32 |
| | | | 438/54 |
| 2015/0372175 A1 | 12/2015 | Yu et al. | |

\* cited by examiner

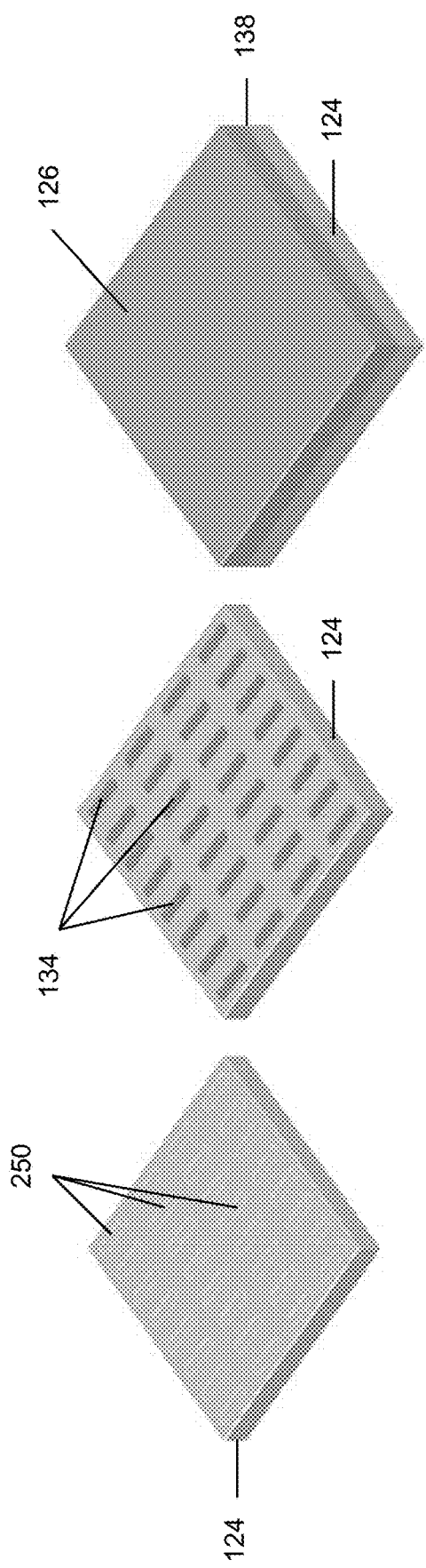
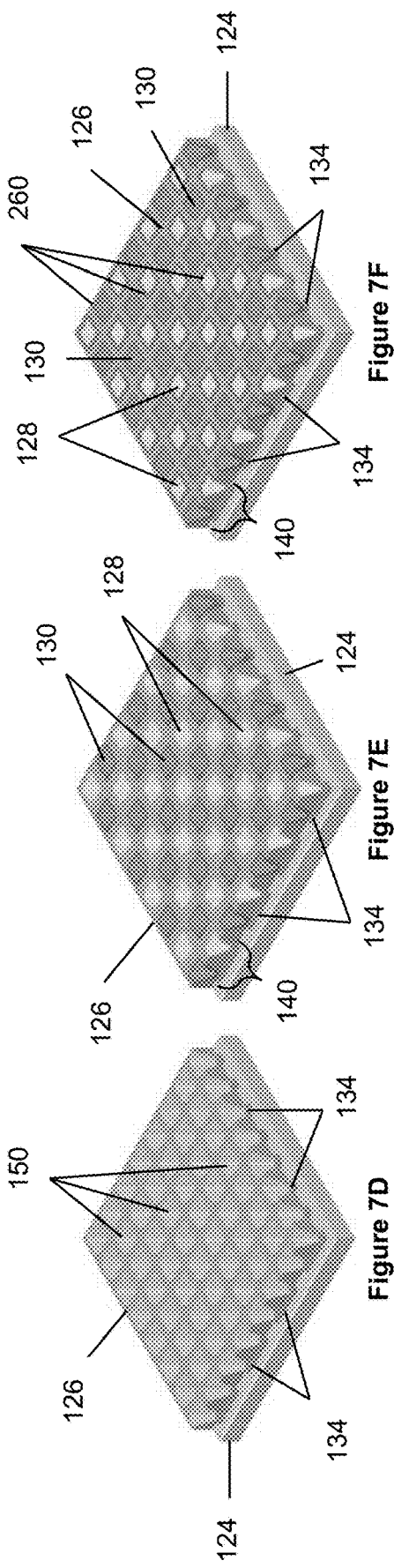
Figure 7A
Figure 7B
Figure 7C
Figure 7D
Figure 7E
Figure 7F

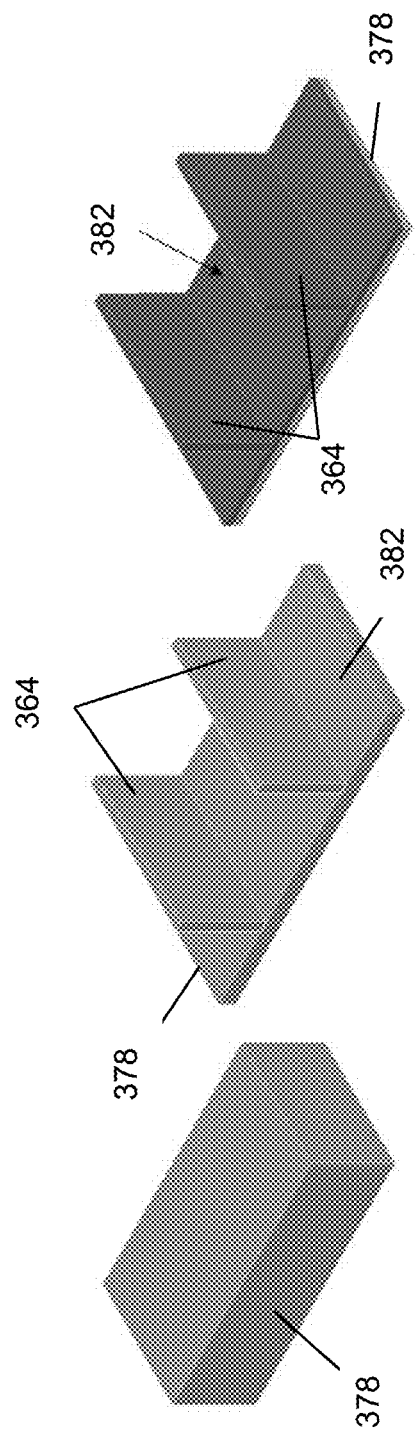

THERMOELECTRIC MICRO-MODULE WITH HIGH LEG DENSITY FOR ENERGY HARVESTING AND COOLING APPLICATIONS

CROSS-REFERENCE TO RELATED APPLICATIONS

This application is a divisional of U.S. patent application Ser. No. 16/071,029 filed on Jul. 18, 2018 which is a U.S. National Phase Application under 35 U.S.C. 371 of International Application No. PCT/US2017/014087 filed on Jan. 19, 2017. This application also claims the benefit of U.S. Provisional Application No. 62/280,274, filed on Jan. 19, 2016. The entire disclosures of the above applications are incorporated herein by reference.

FIELD

The present disclosure relates to the field of micro-scale energy harvesting and refrigeration. In particular, the present disclosure is a design and fabrication method for energy harvesters and coolers utilizing the thermoelectric effect.

BACKGROUND

The thermoelectric effect allows for the generation of an electrical potential from a temperature difference that is generally proportional to the temperature difference. The thermoelectric effect allows electrical power to be directly generated from thermal energy. Conversely, the thermoelectric effect allows for the application of electrical power to move heat to generate a heat gradient. Therefore, the thermoelectric effect can be utilized to create both thermoelectric generators ("TEGs") and thermoelectric coolers ("TECs"). Both thermoelectric devices generally consist of numerous pairs of thermoelectric elements, commonly referred to as "legs," combined into a single module.

Small scale thermoelectric transducers are used for many commercial cooling applications, including central processing unit ("CPU") heatsinks, laser diodes, and charged coupled detectors. There has been a growing interest in using small TEGs to power wireless sensor networks for applications, including structural health monitoring ("SHM"), environmental monitoring, and vehicle maintenance. A possible barrier to the introduction of TEGs to these various applications is the relatively low power generation and voltage output of TEGs.

In general, for maximum power generation, the ideal TEG requires: (1) high thermal resistance across its thermoelectric elements, (2) low internal electrical resistance, and (3) high voltage output per degree (K) of temperature difference across the device. For example, a high thermal resistance allows a large temperature gradient across the thermoelectric elements without the use of large heatsinks, which are often impractical. Furthermore, because the generated voltage is proportional to the temperature difference across the thermoelectric elements, the larger thermal resistance increases power generation and efficiency. Generally, the thermal resistance for commercial micro-fabricated TEGs ranges from 5 K/W to 20 K/W. In the instances of TECs, thermal resistance and electrical resistance are similarly important, however, there is only voltage input.

Characteristics of a TEG are primarily determined by the material properties of the thermoelectric materials comprising the legs and the structural characteristics of the legs, including the active area of the legs, the area density of the thermoelectric legs, and the length of the thermoelectric legs. The active area of the thermoelectric legs refers to the total cross sectional area of the legs perpendicular to the flow of the generated current. The total active area of all the thermoelectric legs over the device area is the fill factor. Generally, the ideal TEG structure includes: (1) long thermal electric legs for increased thermal resistance, (2) a large active area for low electrical resistance, and (3) high leg density for large voltage output. High leg density is especially important for low temperature applications because electronics generally require a minimum voltage to operate.

The relative low performance of TEGs compared to theoretical limits is a result of the difficulty of making thermoelectric legs having the ideal structural characteristics. For example, TEGs generally utilize high performance thin film thermoelectric materials. However, it is generally difficult to deposit the films with sufficient thickness to achieve a high thermal resistance in a vertical configuration. Moreover, lateral configurations, though capable of achieving high thermal resistances, are limited with respect to leg density and fill factor. Other methods have been attempted, but have poor thermoelectric material performance or high costs.

This section provides background information related to the present disclosure which is not necessarily prior art.

SUMMARY

This section provides a general summary of the disclosure, and is not a comprehensive disclosure of its full scope or all of its features.

According to an aspect of the present disclosure, a high-aspect thermoelectric device includes a first and second substrates comprised of thermally conductive materials. The first and second substrates are substantially parallel and sandwich a scaffold member. The scaffold member has a first surface that faces the first substrate and a second surface that faces the second substrate. The first surface of the scaffold member includes a plurality of cavities. The cavities define a plurality of sidewalls formed at an angle less than fifteen degrees from vertical and extending between the first and second substrates. A thermoelectric film comprised of thermoelectric materials is deposited onto the sidewalls of the cavities using a vapor deposition technique.

In certain instances, the thermoelectric materials are deposited onto the sidewalls of the cavities using a physical vapor deposition process, such as evaporation, sputtering, or pulsed laser techniques.

In certain instances, the second substrate is formed of silicon (Si) and the scaffold member is formed from the second substrate.

In certain instances, the high-aspect thermoelectric device also includes a plurality of first contacts interposed between the first substrate and the thermoelectric film. The first contacts may selectively interconnect the individual thermoelectric materials to each other.

In certain instances, the high-aspect thermoelectric device also includes a plurality of second contacts interposed between the second substrate and the thermoelectric film. The second contacts may selectively interconnect the individual thermoelectric materials to each other.

In certain instances, the high-aspect thermoelectric device also includes contacts formed by overlapping adjacent thermoelectric elements.

In certain instances, the deposited thermoelectric materials may have a square frustum shape.

In certain instances, the thermoelectric materials have a height between 10 μm and 500 μm.

In certain instances, the thermoelectric materials are arranged in pairs to form thermoelectric legs. In such instances, each thermoelectric leg pair includes a first leg member comprised of n-type thermoelectric material and a second leg member comprised of p-type thermoelectric material.

In certain instances, the thermoelectric film has a density of thermoelectric legs ranging from 10 to 1000 thermoelectric leg pairs per $mm^2$.

In certain instances, the n-type thermoelectric material is comprised of bismuth telluride ($Bi_2Te_3$); bismuth selenide ($Bi_2Se_3$); gallium nitride (GaN); lead telluride (PbTe); cobalt antimonide ($CoSb_3$); lanthanum telluride (LaTe); bismuth telluride selenide ($Bi_2Te_{(3-x)}Se_x$, wherein x ranges from 0.1 to 1); or combinations thereof.

In certain instances, the p-type thermoelectric material is comprised of antimony telluride ($Sb_2Te_3$); bismuth antimony telluride ($Sb_3BiTe_6$); lead telluride (PbTe); lead tellurium selenide ($Pb_2SeTe$); silicon germanium (SiGe); $(GeTe)_x(AgSbTe_2)_y$, wherein x ranges from 70 to 75 and y equals 100−x; and combinations thereof.

According to another aspect of the present disclosure, a high-aspect thermoelectric device including substantially parallel first and second substrates comprised of thermally conductive material. The second substrate includes a plurality of pillars that extend from a first surface of the second substrate. The pillars each define a first sidewall and a second sidewall. The first sidewalls of the pillars face a first direction. The second sidewalls of the pillars face a second direction that opposes the first direction. The first sidewall and the second sidewall of each pillar are substantially parallel. The pillars in the plurality of pillars are substantially parallel with each other. A thermoelectric film comprised of thermoelectric materials is deposited on the sidewalls of the pillars using a vapor deposition technique.

In certain aspects, the second substrate is comprised of silicon (Si).

In certain aspects, the thermoelectric materials include a first thermoelectric material and a second thermoelectric material. The first thermoelectric material is deposited on the first sidewalls of the pillars. The second thermoelectric material is deposited on the second sidewalls of the pillars.

In certain aspects, the first thermoelectric material is a n-type thermoelectric material selected from the group consisting of: bismuth telluride ($Bi_2Te_3$), bismuth selenide ($Bi_2Se_3$), gallium nitride (GaN), lead telluride (PbTe), cobalt antimonide ($CoSb_3$), lanthanum telluride (LaTe), bismuth telluride selenide ($Bi_2Te_{(3-x)}Se_x$, wherein x ranges from 0.1 to 1), and combinations thereof.

In certain aspects, the second thermoelectric material is a p-type thermoelectric material selected from the group consisting of: antimony telluride ($Sb_2Te_3$), bismuth antimony telluride ($Sb_3BiTe_6$), lead telluride (PbTe), lead tellurium selenide ($Pb_2SeTe$), silicon germanium (SiGe), $(GeTe)_x$ $(AgSbTe_2)_y$, wherein x ranges from 70 to 75 and y equals 100−x, and combinations thereof.

In certain aspects the first thermoelectric material is also deposited on first areas of the second substrate. The first areas of the second substrate are immediately adjacent to the first sidewalls of the pillars.

In certain aspects the second thermoelectric material is also deposited on second areas of the second substrate. The second areas of the second substrate are immediately adjacent to the second sidewalls of the pillars.

In certain aspects, the first areas and the second areas overlap to form third areas of the second substrate. A composite of the first and second thermoelectric materials is deposited on the third areas of the second substrate.

According to another aspect of the present disclosure, a method of fabricating a high-aspect thermoelectric device includes etching a first silicon substrate to form a plurality of pillars. The pillars extend from a first surface of the first substrate. Each pillar defines a first sidewall and a second sidewall. The first sidewalls of the plurality of pillars face a first direction. The second sidewalls of the plurality of pillars face a second direction that opposes the first direction. The first and second sidewalls of each pillar are substantially parallel, and pillars in the plurality of pillars are substantially parallel with each other. The pillars are oxidized and a first thermoelectric material is deposited on the first sidewalls of the pillars from a first source. A second thermoelectric material is deposited on the second sidewalls of each pillar from a second source. A second substrate is bonded onto the first substrate. The second and first substrates together sandwich the thermoelectric materials.

In certain instances, the method also includes depositing the first thermoelectric material on a first area of the first substrate. The first areas of the first substrate are immediately adjacent the first sides of the oxidized pillars.

In certain instances, the method also includes depositing the second thermoelectric material on a second area of the first substrate. The second areas of the first substrate is immediately adjacent to the second side of each oxidized pillar In certain instances, the first areas and the second areas overlap to form third areas of the first substrate. A thermoelectric composition formed of the first and second thermoelectric material is deposited onto the third areas of the first substrates.

In certain instances, the thermoelectric composites form electrical contacts.

In certain instances, the first, second, and third areas of the first substrate are defined by shadow makes deposited on exposed ends of each pillar prior to the deposition of the first and second thermoelectric materials.

In certain instances, the first thermoelectric material is a n-type thermoelectric material comprised of bismuth telluride ($Bi_2Te_3$); bismuth selenide ($Bi_2Se_3$); gallium nitride (GaN); lead telluride (PbTe); cobalt antimonide ($CoSb_3$); lanthanum telluride (LaTe); bismuth telluride selenide ($Bi_2Te_{(3-x)}Se_x$, wherein x ranges from 0.1 to 1); or combinations thereof.

In certain instances, the second thermoelectric material is a p-type thermoelectric material comprised of antimony telluride ($Sb_2Te_3$); bismuth antimony telluride ($Sb_3BiTe_6$); lead telluride (PbTe); lead tellurium selenide ($Pb_2SeTe$); silicon germanium (SiGe); $(GeTe)_x(AgSbTe_2)_y$, wherein x ranges from 70 to 75 and y equals 100−x; and combinations thereof.

In certain instances, each pillar has a height between 10 μm and 100 μm.

In certain instances, the pillars are separated from each other by a distance between 10 μm and 100 μm.

In certain instances, the first the first source is positioned at a first angle relative to the first silicon substrate, and the second source is positioned at a second angle relative to the first silicon substrate.

In certain instances, the first source deposits the first thermoelectric material and the second source deposited the second thermoelectric material simultaneously.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4:
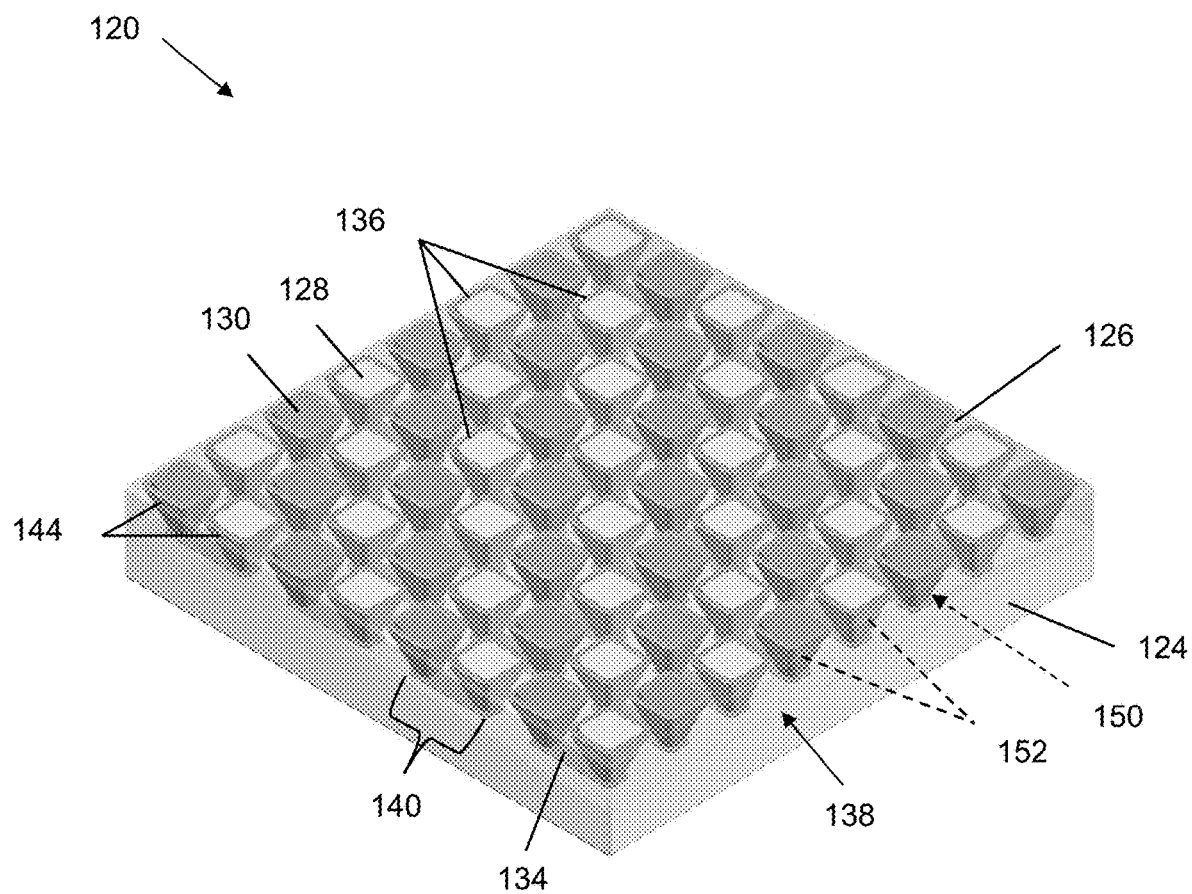
FIG. 4 is a prospective view of an exemplary thermoelectric device, wherein the scaffold member is intact.

FIGS. 7A-7F illustrate an exemplary method for fabricating the thermoelectric device illustrated in FIG. 4. FIG. 7A illustrates a substrate etched to form routing grooves. FIG. 7B illustrates deposition of routing metal into the grooves of the etch substrate. FIG. 7C illustrates the bonding of a scaffold member to the bottom substrate. FIG. 7D illustrates the etching of the silicon substrate. FIG. 7E illustrates deposition of thermoelectric materials onto the scaffold member (as further illustrated in FIGS. 8-10B). FIG. 7F illustrates deposition of a top contact onto the deposited thermoelectric materials.

Figure 8:
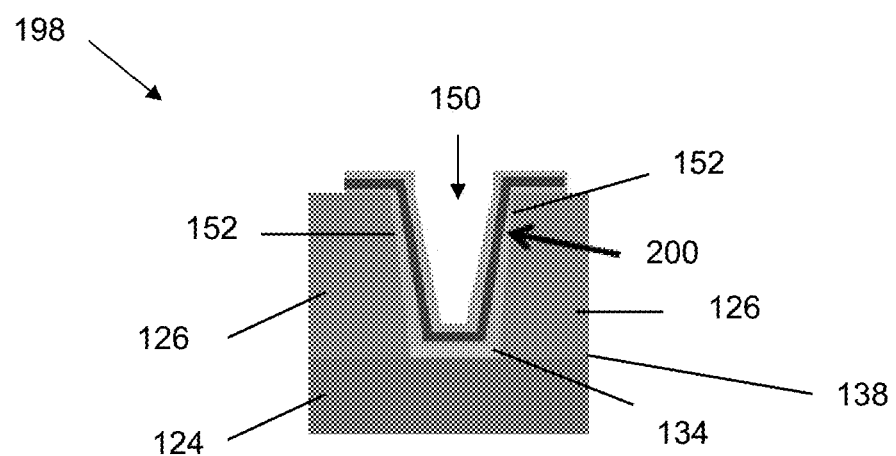

FIG. 8 illustrates a direct sputtering method for depositing thermoelectric materials onto the scaffold member.

Figure 9A:
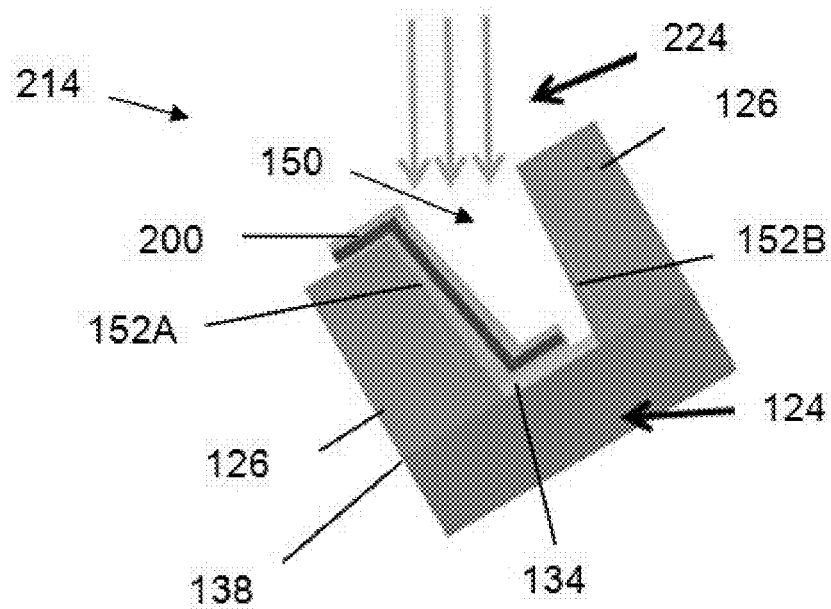
Figure 9B:
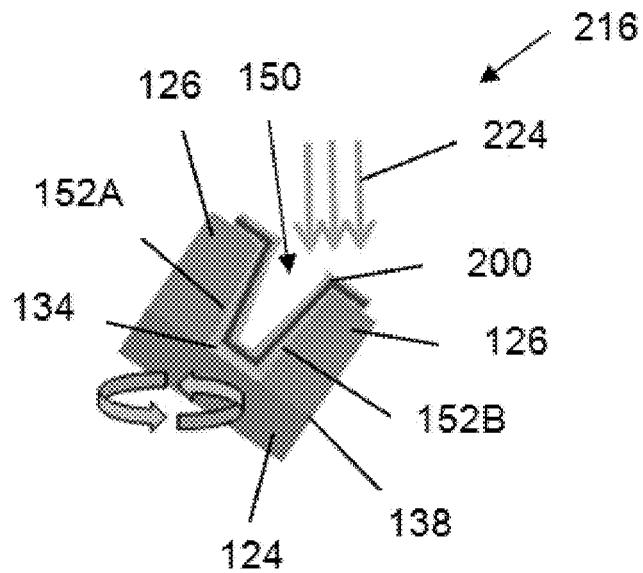

FIGS. 9A-9B illustrates an angled evaporation method for depositing thermoelectric materials onto the scaffold member. FIG. 9A illustrates a scaffold member mounted at a first angle relative to a source. FIG. 9B illustrates the scaffold member mounted at a second angle relative to the source.

Figure 10A:
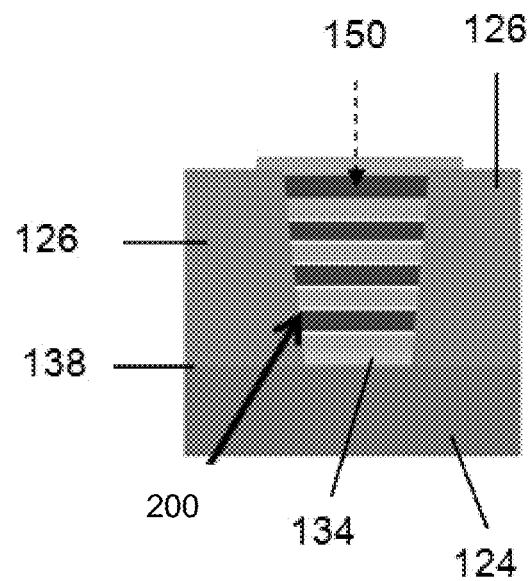
Figure 10B:
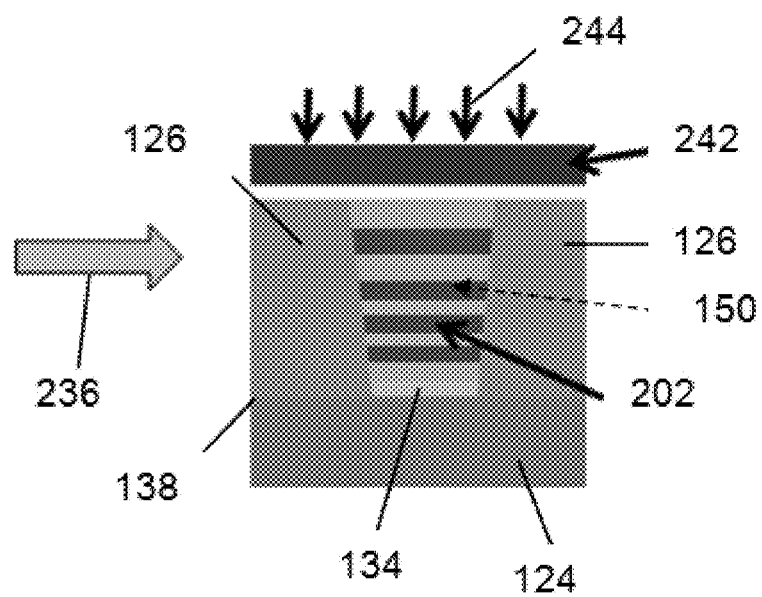

FIGS. 10A-10B illustrates a hard press method for depositing thermoelectric materials onto the scaffold member. FIG. 10A illustrates the deposition of powdered thermoelectric material within a cavity. FIG. 10B illustrates the heating and pressing of the deposited thermoelectric material to form a solid thermoelectric block.

Figure 11:
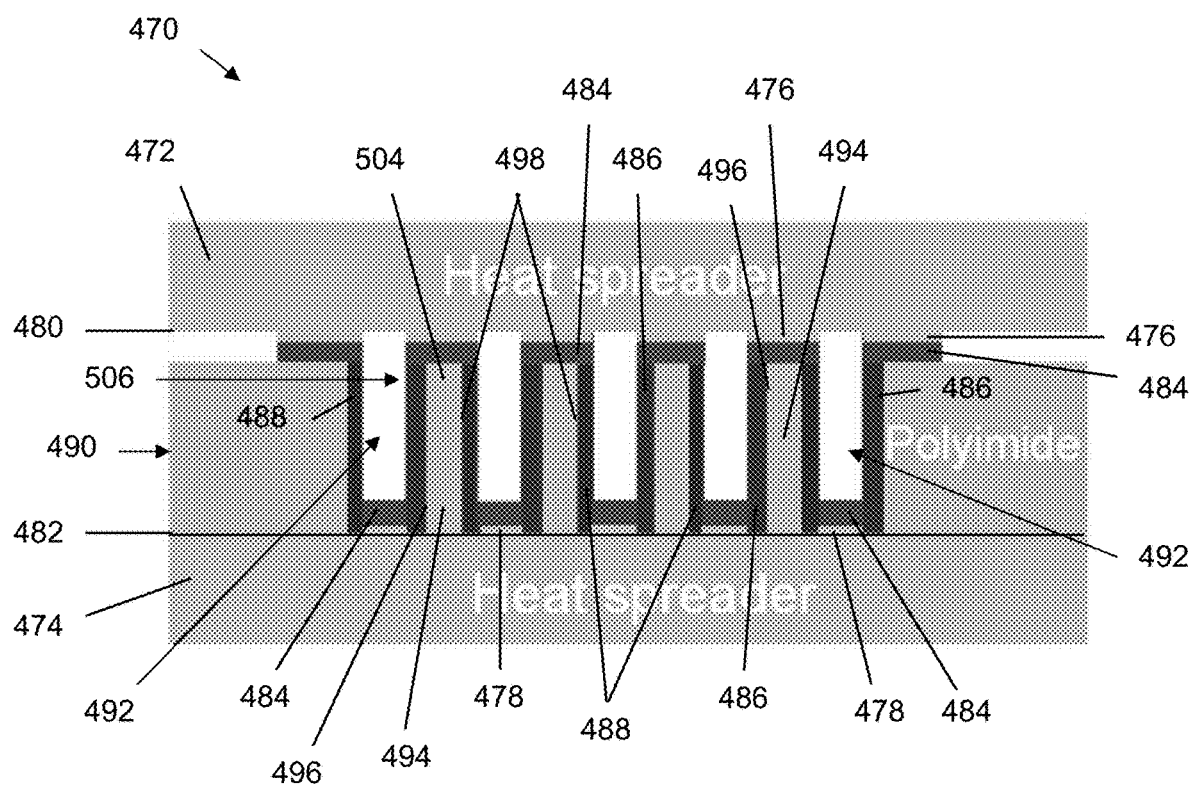

FIG. 11 is a cross-section of another exemplary thermoelectric device, wherein the sidewalls are substantially parallel.

Figure 12:
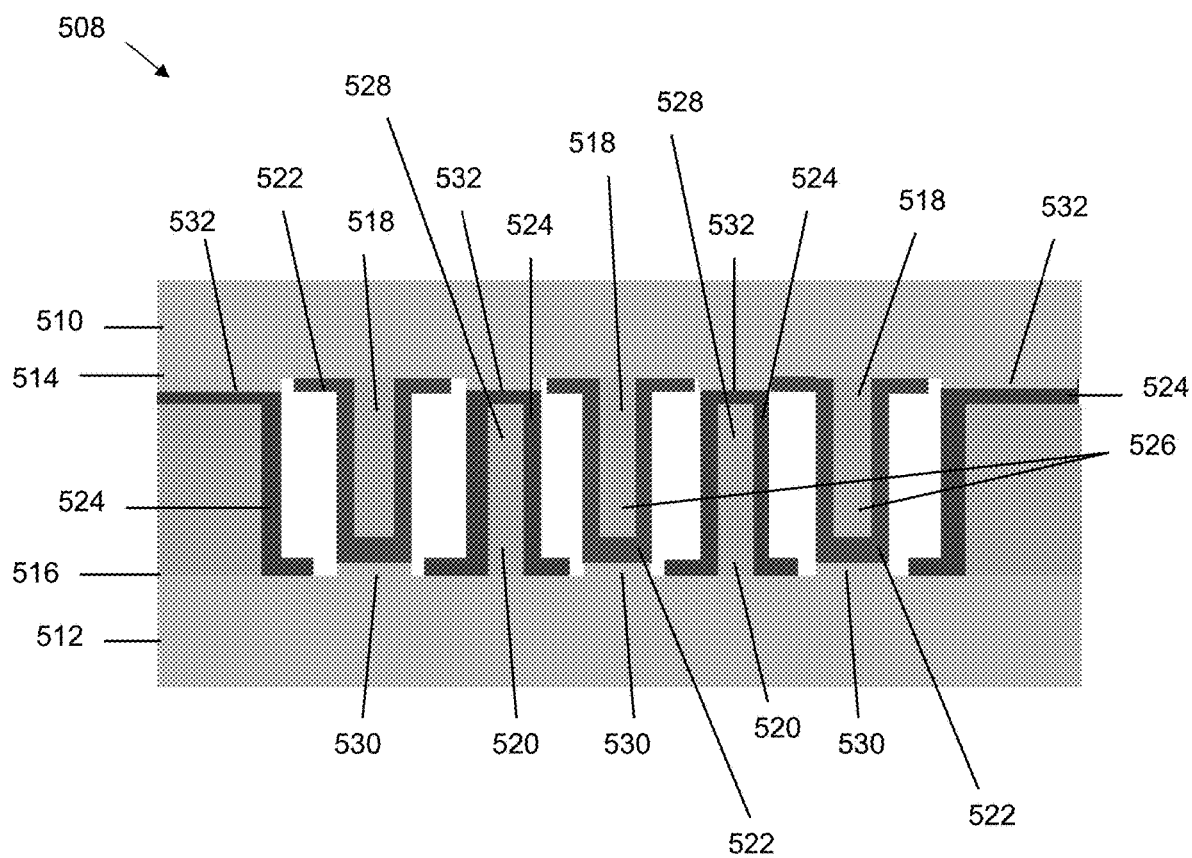

FIG. 12 is a cross-section of an exemplary thermoelectric device similar to that illustrated in FIG. 11, wherein the top substrate includes a plurality of pillars that interlock with the pillars of the bottom substrate and thermoelectric materials are deposited on the alternating pillars of the top and bottom substrate.

Figure 13:
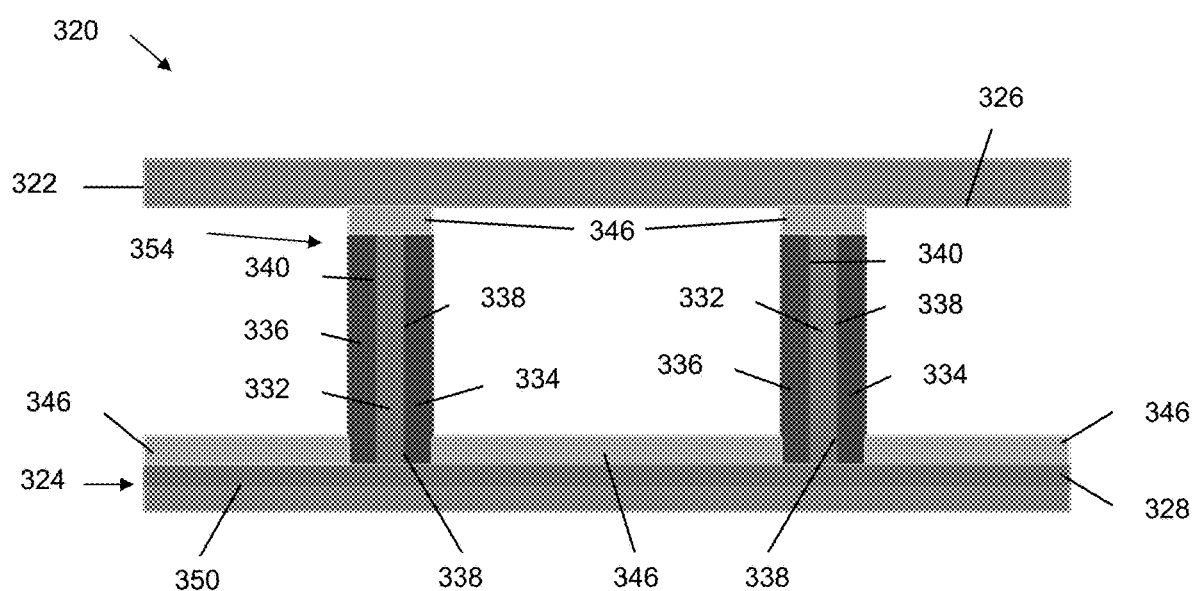

FIG. 13 is a cross-section of an exemplary thermoelectric device similar to that illustrated in FIG. 11, wherein the scaffold is constructed from the bottom substrate.

Figure 14:
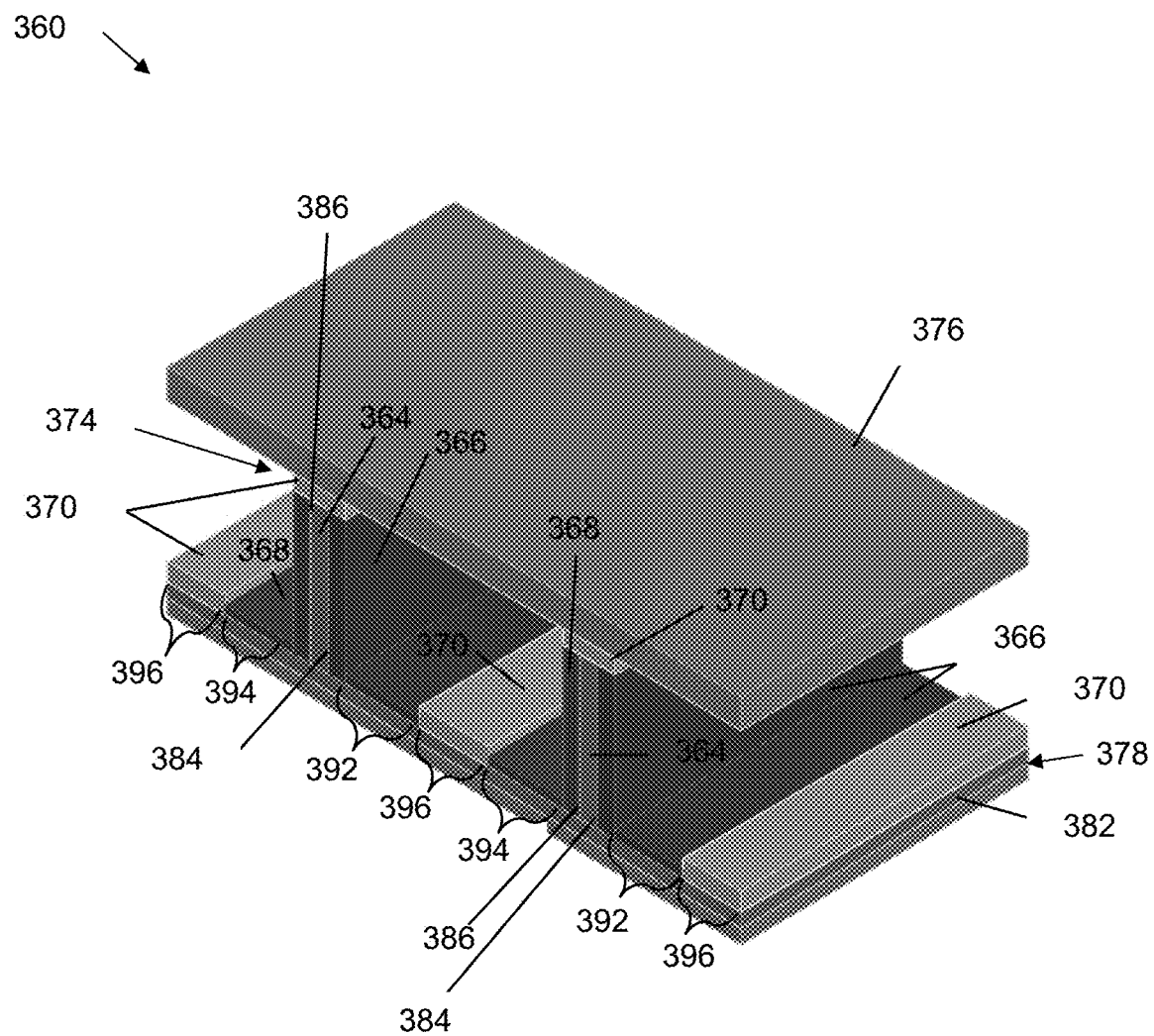

FIG. 14 is a cross-section of an exemplary thermoelectric device similar to that illustrated in FIG. 13, wherein thermoelectric materials are also deposited on the first surface of the bottom substrate.

Figure 15D:
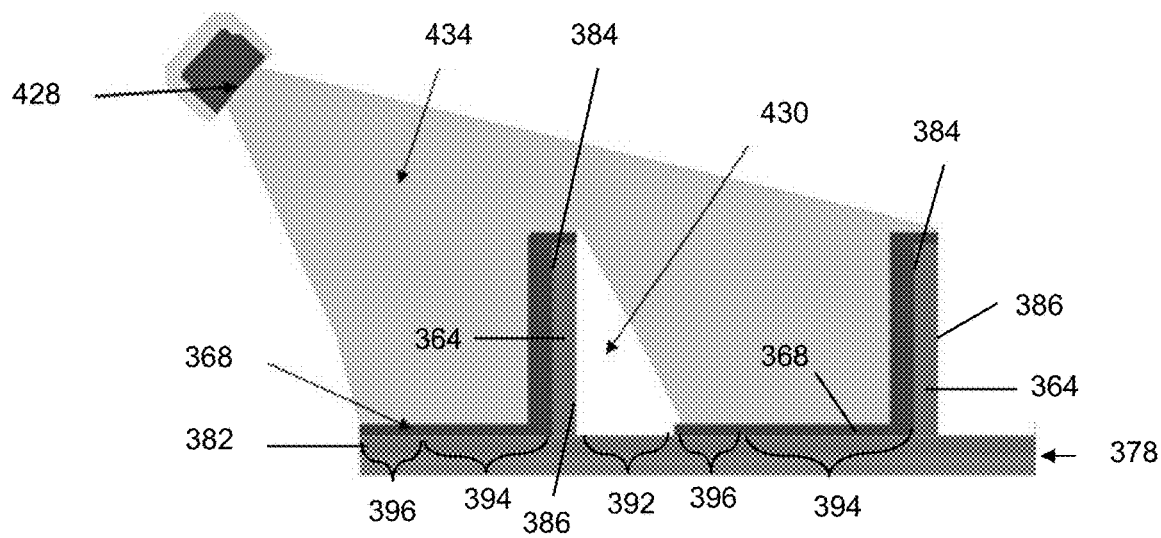
Figure 15E:
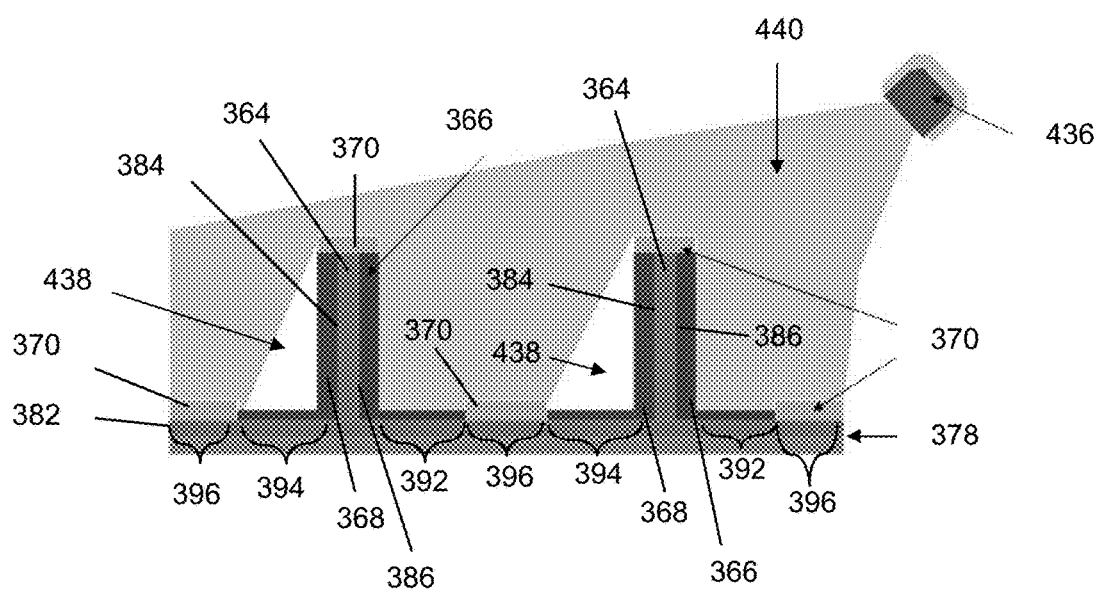

FIGS. 15A-15E illustrates an exemplary method for fabricating the thermoelectric device illustrated in FIG. 14. FIG. 15A illustrates a blocked starting material. FIG. 15B illustrates the etched bottom substrate. FIG. 15C illustrates the oxidization of the pillars. FIG. 15D illustrates the deposition of the first thermoelectric material onto pillars and the bottom substrate. FIG. 15E illustrates the deposition of the second thermoelectric material onto the pillars and the bottom substrate.

Figure 16:
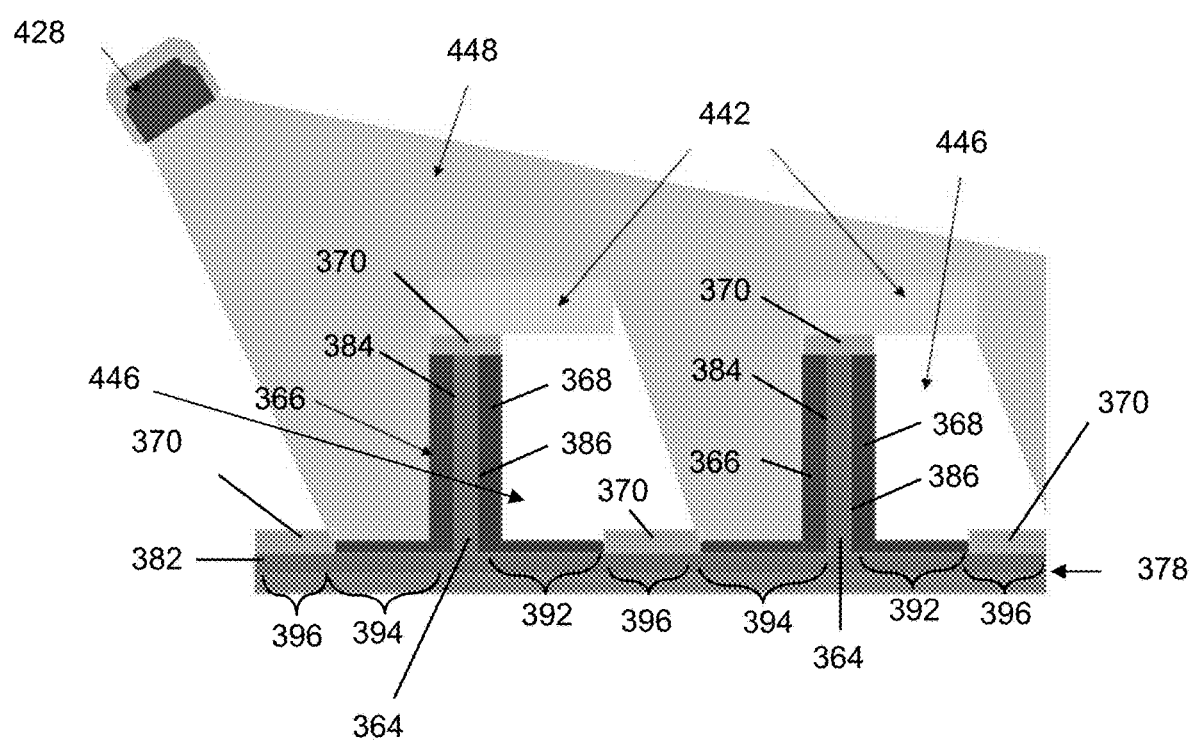

FIG. 16 illustrates an exemplary method for fabricating a thermoelectric device, wherein the method includes using shadow masks of various types.

Figure 17:
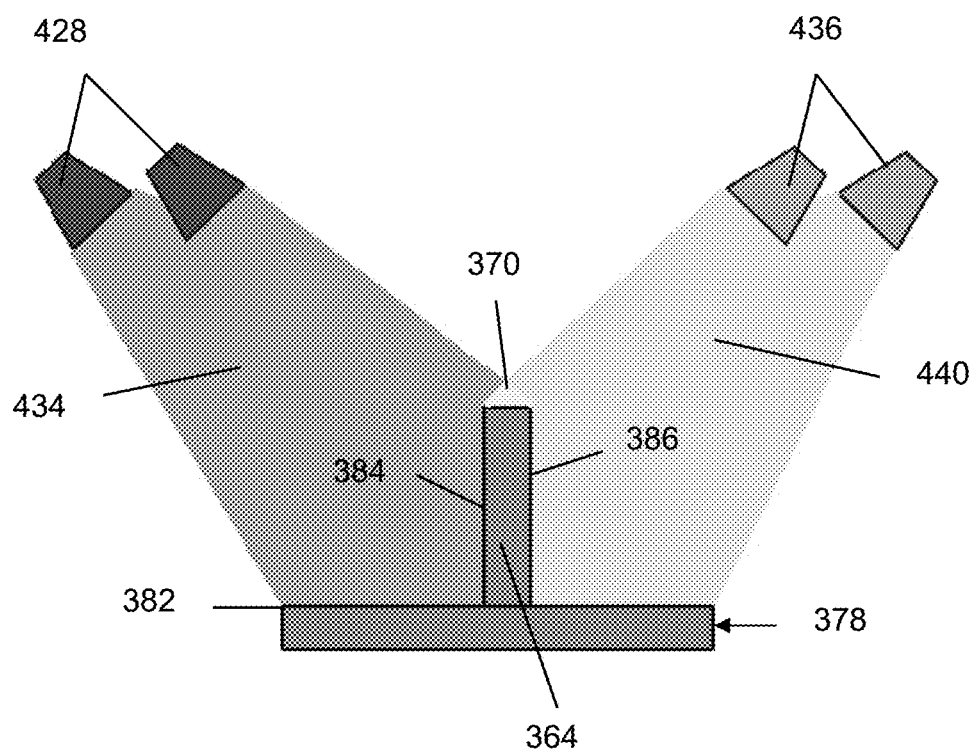

FIG. 17 illustrates an exemplary method for fabricating a thermoelectric device, wherein the method includes simultaneously depositing of the first and second thermoelectric materials.

Figure 18C:
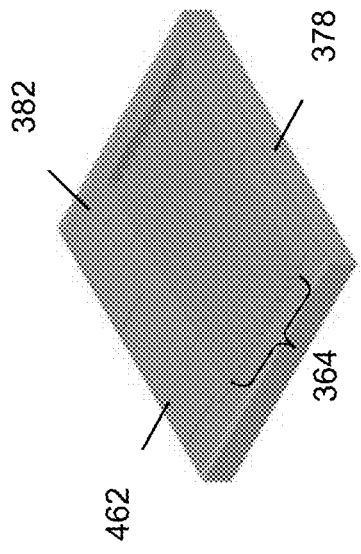
Figure 18B:
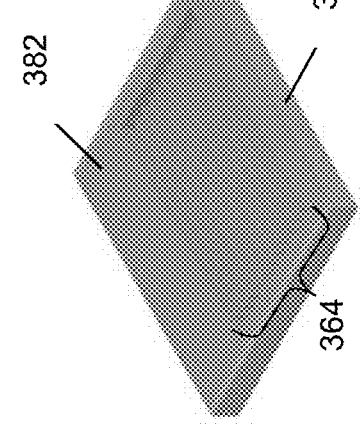
Figure 18A:
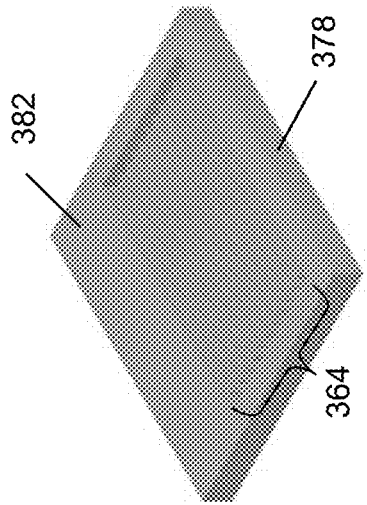
Figure 18E:
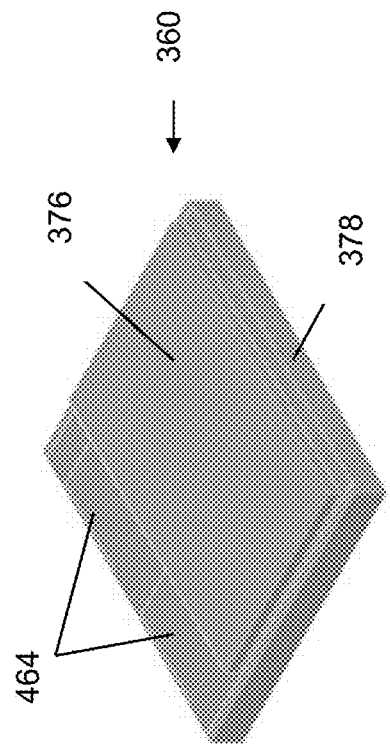
Figure 18D:
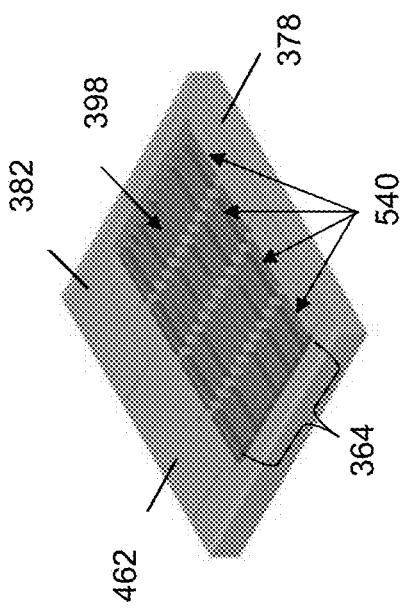

FIGS. 18A-18E provide another illustration of the exemplary method of FIGS. 15A-15E. FIG. 18A illustrates the etched bottom substrate. FIG. 18B illustrates the oxidation of the pillars and the first surface of the bottom substrate. FIG. 18C illustrates metal patterning of the bottom substrate. FIG. 18D illustrates deposition of the thermoelectric materials. FIG. 18E illustrates deposition of the top substrate.

Corresponding reference numerals indicate corresponding parts throughout the several views of the drawings.

DETAILED DESCRIPTION

Example embodiments will now be described more fully with reference to the accompanying drawings.

High-aspect, micro-scale vertical thermoelectric modules, or devices, having high thermal resistance and high efficiency are disclosed herein. Long thermoelectric materials are integrated into a thermoelectric device in a compact and area efficient manner. In general, the thermoelectric devices includes thermoelectric material deposited over a scaffold patterned by traditional microelectromechanical systems ("MEMS") etching techniques. The deposited thermoelectric material conforms to the shape of the scaffold and forms thermoelectric leg pairs. MEMS based micromachining of the scaffold allows high density patterns to be formed and, subsequently, high thermoelectric leg densities. Additionally, the length of the thermoelectric legs and, thus, the thermal resistance, is uncoupled from the thickness of the thermoelectric film allowing for the creation of long, resistive thermoelectric legs with a vertical orientation. The present thermoelectric devices are compatible with numerous thermoelectric materials. The thermoelectric devices may be used in cooling and energy harvesting applications.

Figure 1:
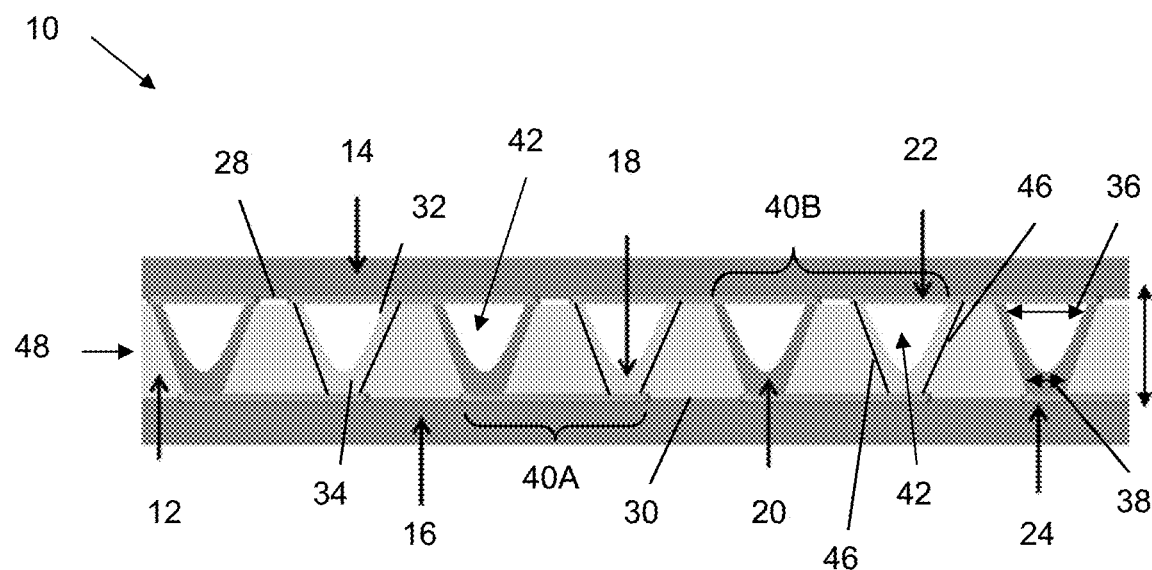
FIG. 1 is a cross-section of an exemplary thermoelectric device, wherein the scaffold member is intact, cavities of the scaffold member have sidewalls that are substantially vertical with respect to the bottom substrate, and thermoelectric materials coat the sidewalls.

FIG. 1 illustrates an exemplary thermoelectric device 10, wherein the scaffold member 12 is intact, cavities 42 of the scaffold member 12 have sidewalls 46 that are substantially vertical with respect to a bottom substrate 16, and thermoelectric materials 18, 20 coat the sidewalls 46 of the cavities 42.

The thermoelectric device 10 includes a first substrate 14 (e.g., a top substrate) opposing a second substrate 16 (e.g., a bottom substrate). The top substrate 14 is substantially parallel with the bottom substrate 16. The top substrate 14 has a first surface 28 that faces a first surface 30 of the bottom substrate 16. The top and bottom substrates 14, 16 have a distance between them ranging from 10 μm to 500 μm. For example, the distance between the top and bottom substrates 14, 16 may be between 20 µm and 200 µm. The top and bottom substrates 14, 16 may have a thickness of 500 µm.

The top and bottom substrates 14, 16 are comprised of thermally conductive materials that have undergone passivation to prevent electrical shorting of the thermoelectric device 10. For example, the top and bottom substrates 14, 16 comprise silicon (Si), aluminum (Al), nitride ($N^{3-}$), silicon-germanium (SiGe), gallium arsenide (GaAs), or combinations thereof. In certain instances, the top and bottom substrates 14, 16 may include flexible polyimide. The top and bottom substrates 14, 16 function as thermal terminals and packaging. The top substrate 14 may be a hot side, and the bottom substrate 16 a cold side.

A plurality of first contacts 22 (e.g., top contacts) are deposited on the first surface 28 of the top substrate 14. A plurality of second contacts 24 (e.g., bottom contacts) are deposited on the first surface 30 of the bottom substrate 16. The top and bottom contacts 22, 24 are sandwiched by the top and bottom substrates 14, 16. The top and bottom contacts 22, 24 are electrical routings. For example, the top and bottom contacts 22, 24 comprise solder; eutectic alloy; other metal capable of thermocompression bonding, such as gold (Au), copper (Cu), or aluminum (Al); or combinations thereof.

A scaffold member (e.g., mold) 12 is deposited between the top and bottom substrates 14, 16. The scaffold member 12 is sandwiched by the top and bottom substrates 14, 16. In certain instances, an adhesion layer (not shown) may be deposited between the scaffold member 12 and the bottom substrate 16. The adhesion layer may comprise chromium (Cr) or titanium (Ti) and have a thickness of less than or equal to 30 nm. In certain instances, a polymer bonding layer (not shown) may be deposited between the scaffold member 12 and the top substrate 14.

The scaffold member 12 is comprised of thermally and electrically isolating materials and mechanically supports the force of a bond from the top substrate 14. For example, the scaffold member 12 is comprised of silicon (Si); fused silica or silicon oxide ($SiO_2$); SU-8; poly(methyl methacrylate) ("PMMA"); polyimide ("PI"); benzocyclobutene ("BCB:); or combinations thereof. The scaffold member 12 has a thickness ranging from 10 µm to 500 µm. For example, the scaffold member 12 may have a thickness between 20 µm and 200 µm.

The scaffold member 12 includes a plurality of cavities 42. The cavities 42 each comprise four sidewalls 46, which together form the cavity 42. Cross-sections of two of the sidewalls 46 are shown FIG. 1. Each sidewall 46 has a first and second end 32, 34. The first ends 32 face the first surface 28 of the top substrate 14, and the second ends 34 face the first surface 30 of the bottom substrate 16. The first and second ends 32, 34 make contact with the top and bottom contacts 22, 24, respectively.

The sidewalls 46 are substantially vertical with respect to the bottom substrate 16. For example, as seen in FIG. 1, the sidewalls may be formed at an angle less than fifteen degrees from vertical relative to the bottom substrate 16. In other words, a first distance 36 separates opposing sidewalls 46 at the first end 32, and a second distances 38 separates opposing sidewalls 46 at the second end 34. For example, the four sidewalls 46 together may form a cavity 42 having a square frustum shape. However, it is understood that the sidewalls 46 may form cavities 42 having other shapes, including shapes wherein the first distance 36 is larger than the second distance 38 and shapes wherein the first distance 36 equals the second distance 38.

The scaffold member 12 provides a vertical substrate upon which a thermoelectric film, comprising n-type and p-type thermoelectric materials 18, 20, is deposited. In particular, the n-type and p-type thermoelectric materials 18, 20 rest on (i.e., coat) the sidewalls 46 of the cavities 42. Thus, the thermoelectric materials 18, 20 have a shape corresponding to the sidewalls 46 the cavities 42. Therefore, for example, the deposited thermoelectric materials 18, 20 may outline a square frustum, (i.e., forms a hollow square frustum). As such, the patterning of the scaffold member 12 defines the length and density of the thermoelectric materials 18, 20. The thermoelectric materials 18, 20 may have a height ranging from 10 µm to 500 µm. For example only, the thermoelectric materials 18, 20 may have a height between 20 µm and 200 µm.

N-type and p-type thermoelectric materials 18, 20 are deposited in alternating cavities 42. As seen in FIG. 1, a n-type thermoelectric material 18 is deposited in a first cavity 42 that is sandwiched by second and third cavities 42 in which p-type thermoelectric materials 20 are deposited. The thermoelectric materials 18, 20 are arranged in pairs to form thermoelectric leg pairs 40. Each thermoelectric leg pair 40 including a first leg member comprised of the n-type thermoelectric material 18 and a second leg member comprised of the p-type thermoelectric material 20. The scaffold member 12 and the thermoelectric legs 40 together form a thermoelectric layer 48. The thermoelectric legs 40 may have a length ranging from 10 µm to 500 µm. For example only, the thermoelectric legs 40 may have a length between 20 µm and 150 µm.

The n-type thermoelectric material 18 is comprised of bismuth telluride ($Bi_2Te_3$); bismuth selenide ($Bi_2Se_3$); gallium nitride (GaN); lead telluride (PbTe); cobalt antimonide ($CoSb_3$); lanthanum telluride (LaTe); bismuth telluride selenide ($Bi_2Te_{(3-x)}Se_x$, wherein x ranges from 0.1 to 1); or combinations thereof. The p-type thermoelectric material 20 is comprised of antimony telluride ($Sb_2Te_3$); bismuth antimony telluride ($Sb_3BiTe_6$); lead telluride (PbTe); lead tellurium selenide ($Pb_2SeTe$); silicon germanium (SiGe); $(GeTe)_x(AgSbTe_2)_y$, wherein x ranges from 70 to 75 and y equals 100–x; or combinations thereof.

The thermoelectric materials 18, 20 make contact with the top and bottom contacts 22, 24. The top and bottom contacts 22, 24 connect the thermoelectric materials 18, 20 to one another, as well as thermoelectric leg pairs 40 to one another. Thus, each bottom contact 24 makes contact with a first thermoelectric leg pair 40A, while each top contact 22 makes contact with both first and second thermoelectric leg pairs 40A, 40B. It is understood, however, that in other instances, among other arrangements, the top contacts may make contact with a first thermoelectric leg pair, while the bottom contacts with both first and second thermoelectric leg pairs.

Figure 2:
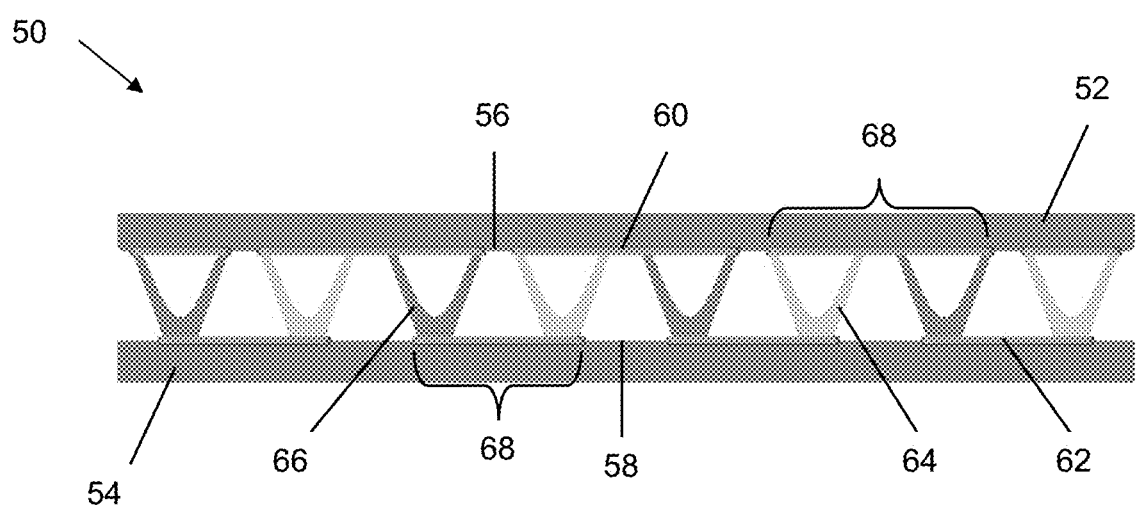
FIG. 2 is a cross-section of an exemplary thermoelectric device similar to that illustrated in FIG. 1, wherein the scaffold member has been removed.

FIG. 2 illustrates an exemplary thermoelectric device 50 that is similar to thermoelectric device 10 of FIG. 1 except the scaffold member has been removed. In certain instances, removal of the scaffold member allows for increased thermal resistance. When the scaffold member comprises silicon oxide, hydrogen fluoride (HF) wet or vapor etching may be used to remove the scaffold member. Solvent etching or oxygen plasma etching may be used to remove polymer scaffold members.

The thermoelectric device 50 comprises a top substrate 52 opposing a bottom substrate 54; a plurality of top and bottom contacts 60, 62 deposited on first surfaces 56, 58 of the top and bottom substrates 52, 54, respectively; and a plurality of alternating n-type and p-type thermoelectric materials 64, 66 deposited therebetween, which together form thermoelectric leg pairs 68. Similar to FIG. 1, the deposited thermoelectric materials 64, 66 may each have a square frustum shape, which has a "v" or "u" shaped cross-section. As seen in FIG. 2, the close-end of the "v" or "u" cross-section faces the first surface 58 of the bottom substrate 54 and makes contact with one of the bottom contacts 62. While the open-end of the "v" or "u" cross-section faces the first surface 56 of the top substrate 52 and makes contact with one of the top contacts 60.

Figure 3:
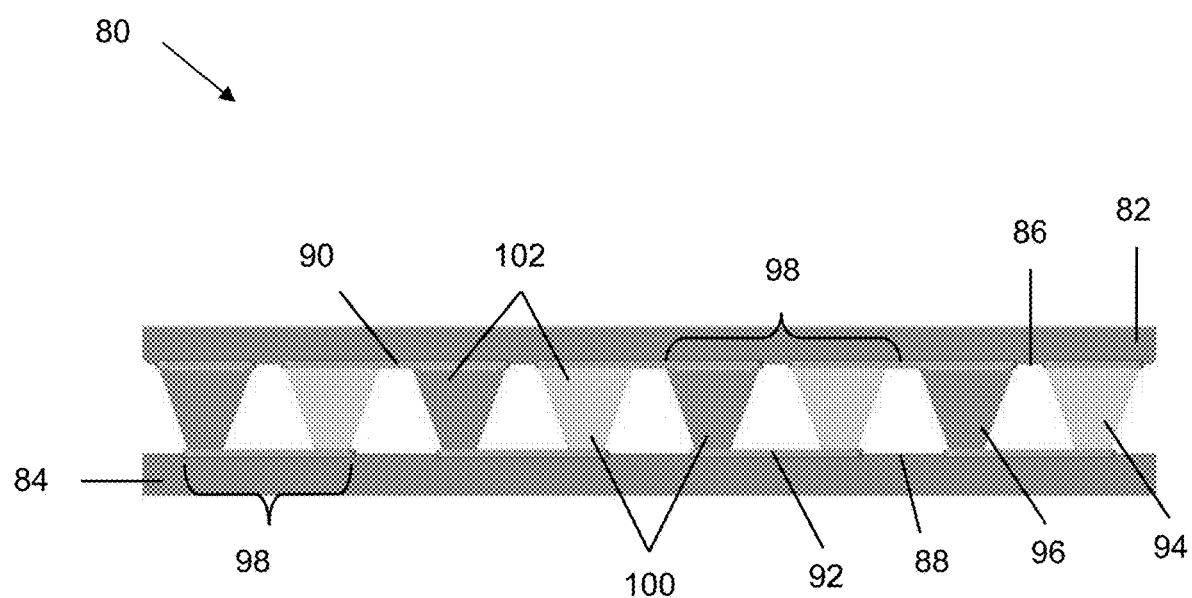
FIG. 3 is a cross-section of an exemplary thermoelectric device similar to that illustrated in FIG. 2, wherein the thermoelectric materials form solid thermoelectric blocks.

FIG. 3 illustrates an exemplary thermoelectric device 80 similar to thermoelectric device 50 of FIG. 2 except the thermoelectric materials form solid thermoelectric blocks. In certain aspects, the thermoelectric device 80 may utilize in-plane properties. In other aspects, the thermoelectric device 80 may utilize out-of-plane properties. In other aspects still, the thermoelectric device 80 may utilize both in-plane and out-of-plane properties. As discussed with respect to FIGS. 8-10B below, the properties of the thermoelectric devices may be dependent upon the chosen deposition method.

The thermoelectric device 80 comprises a top substrate 82 opposing a bottom substrate 84; a plurality of top and bottom contacts 90, 92 deposited on first surfaces 86, 88 of the top and bottom substrates 82, 84, respectively; and a plurality of alternating n-type and p-type thermoelectric materials 94, 96 deposited therebetween, which together form thermoelectric leg pairs 98. Similar to FIG. 2 the scaffolding member has been removed. Similar to FIGS. 1 and 2, the deposited thermoelectric materials 94, 96 may take a square frustum shape having a first end 100 facing the first surface 88 of the bottom substrate 84 and a second end 102 facing the first surface 86 of the top substrate 82. However, unlike the thermoelectric materials of the previous embodiments, the thermoelectric materials 94, 96 of thermoelectric device 80 have a solid cross-section.

FIG. 4 provides a prospective view of an exemplary thermoelectric device 120, wherein the scaffold member 126 is intact. Similar to thermoelectric device 10 of FIG. 1, the thermoelectric device 120 may include thermoelectric materials 128, 130 that coat the sidewalls 152 of respective cavities 150. Alternatively, similar to thermoelectric device 80 of FIG. 3, the thermoelectric device 120 may include thermoelectric materials 128, 130 that form solid thermoelectric blocks. Solid thermoelectric block materials have a higher fill factor and a lower thermal resistance and will be used when the TEG system can rapidly reject heat (e.g., large heatsink). Thermoelectric coatings are used when limited by the heatsink. However, in certain aspects, thermoelectric coatings are used in a continuum and may be increased until the coating resembles a solid block. The nature of the thermoelectric materials 128, 130 is visually indeterminable in the present prospective view.

Similar to the previous embodiments, the thermoelectric device 120 comprises a bottom substrate 124; a plurality of bottom contacts 134 disposed on a first surface 138 of the bottom substrate 124; a scaffold member 126; a plurality of thermoelectric materials 128, 130; and a plurality of top contacts 136 deposited on a top surface 144 of the thermoelectric materials 128. The scaffold member 126 is deposited on the first surface 138 of the bottom substrate 124 and has plurality of cavities 150. N-type and p-type thermoelectric materials 128, 130 are respectively deposited within alternating cavities 150.

Figure 5:
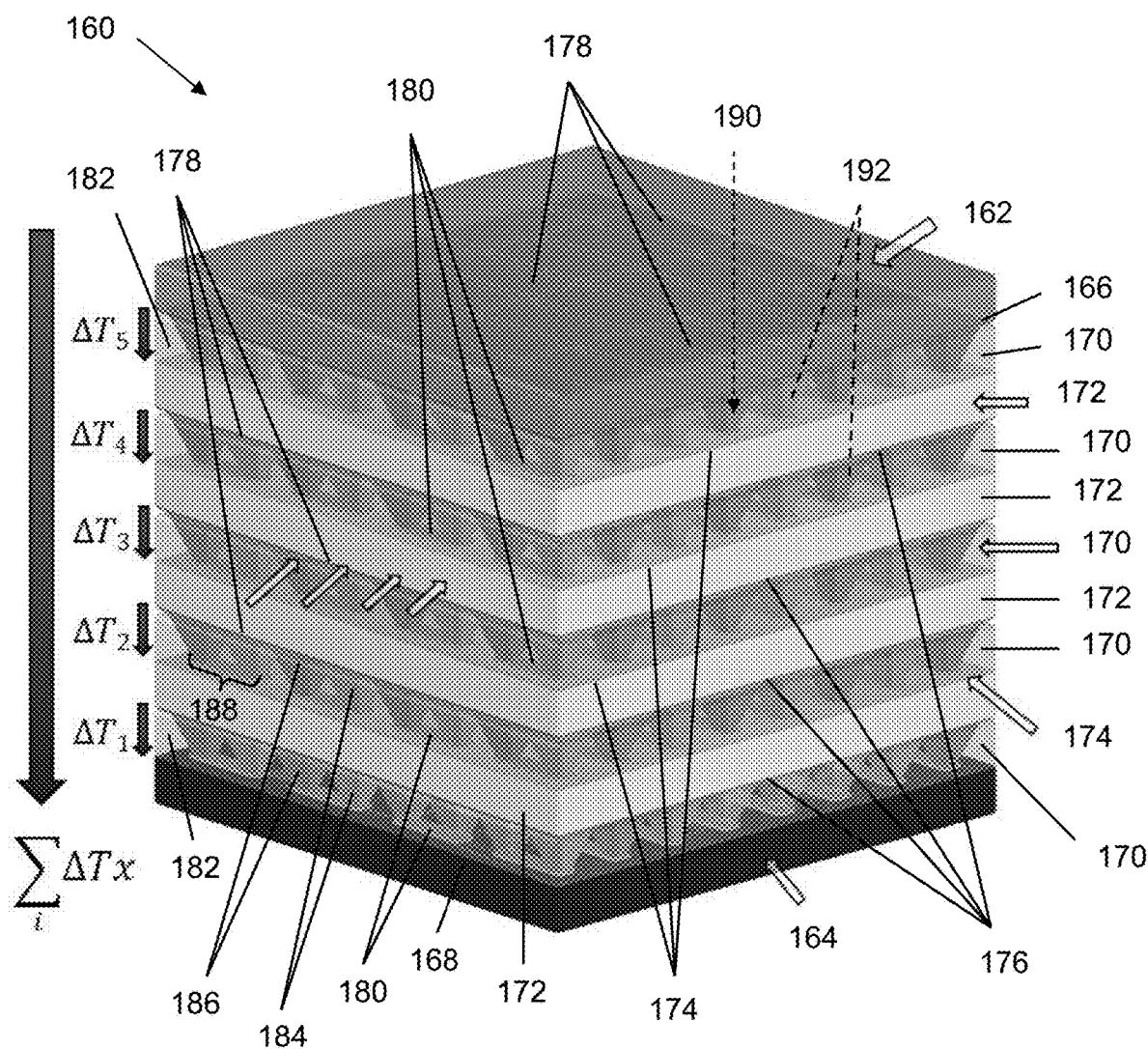
FIG. 5 is a prospective view of an exemplary thermoelectric device having a serial stacked configuration.

FIG. 5 illustrates an exemplary thermoelectric device 160 having a serial stacked configuration. The substrate and thermoelectric layers forming the serial stacked configuration of the present thermoelectric device 160 each have features comparable to those of the signal layer thermoelectric devices described above. However, in general, thermoelectric devices having multiple layers (i.e., a stacked configuration) produce greater temperature gradients when operated as a cooler than thermoelectric devices having a single layer. The multiple layers are each capable of maintaining a certain temperature drop before joule heating and heat conduction limits the cooling effect. If appropriately sized, the use of multiple layers increases thermal resistance and limits joule heating. The device is appropriately sized if the first layer (i.e., the layer contacting the element to be cooled) has the smallest heat pump capacity and the second layer (i.e., the layer adjacent to the first layer) has a larger heat pump capacity to pump heat from the first stage and the additional heat from joule heating. The last stage will have the greatest capacity because of the need to pump the original heat plus additional heat from the joule heating of the previous layers, or stages.

The thermoelectric device 160 includes top and bottom substrates 162, 164 that are substantially parallel and that sandwich a plurality of middle substrates 172 and thermoelectric layers 170. Each middle substrate has a first side 174 opposing a second side 176. The first side 174 faces a first surface 166 of the top substrate 162, and the second side 176 faces a first surface 168 of the bottom substrate 164. First contacts 178 are deposited on the first surface 166 of the top substrate 162 and the second side 176 of each middle substrate 172. Second contacts 180 are deposited on the first surface 168 of the bottom substrate 164 and the first side 174 of each middle substrate 172.

Scaffold members 126 are sandwiched by the plurality of substrates 162, 164, 172. A first scaffold member 126 is deposited between the top substrate 162 and a first middle substrate 172. A second scaffold member 126 is deposited between the bottom substrate 164 and a final middle substrate 172. Other scaffold members 126 are deposited between corresponding middle substrate layers 172. As in the previous embodiments, each scaffold member 126 includes a plurality of cavities 190 and n-type and p-type thermoelectric materials 184, 186 are respectively deposited within alternate cavities 190. Similar to thermoelectric device 10 of FIG. 1, the present thermoelectric materials 184, 186 of thermoelectric device 160 may coat the sidewalls 192 of respective cavities 190. Alternatively, similar to thermoelectric device 80 of FIG. 3, thermoelectric device 160 may include thermoelectric materials 184, 186 that form solid thermoelectric blocks. Similar to FIG. 4, the nature of the thermoelectric materials 184, 186 is visually indeterminable in the present prospective view.

Figure 6:
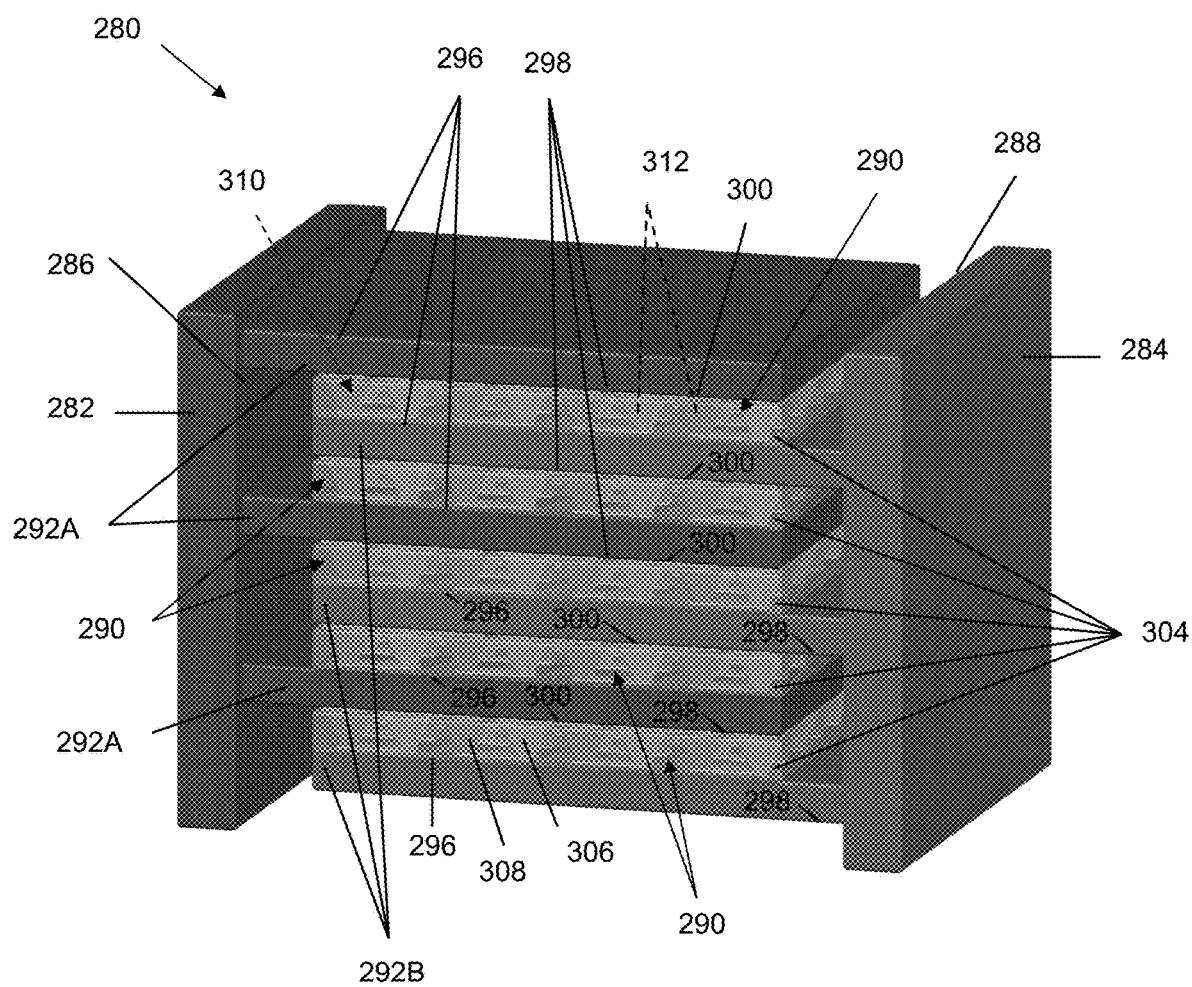
FIG. 6 is a prospective view of an exemplary thermoelectric device having a parallel stacked configuration.

FIG. 6 illustrates an exemplary thermoelectric device 280 having a parallel stacked configuration. Similar to thermoelectric device 160 of FIG. 5, thermoelectric device 280 includes a plurality of stacked substrate and thermoelectric layers. However, unlike thermoelectric device 160, thermoelectric device 280 also includes opposing left and right substrates that sandwich the stacked substrate and thermoelectric layers. Parallel stacked configurations can increase the area of the thermoelectric material and thereby allow more energy to be harvested in a TEG and, comparatively, more heat to be pumped for a given device size in a TEC.

The thermoelectric device 280 includes left and right substrates 282, 284 that are substantially parallel and that sandwich a plurality of middle substrates 292 and thermoelectric layers 290. The middle substrate layers 292 and thermoelectric layers 209 are substantially parallel. The middle substrate layers are coupled to and extend from one of the left or right substrates 282, 284. A first set first set of middle substrates 292A are coupled to and extend from a first surface 286 of the left substrate 282, while a second set of middle substrates 292B are coupled to and extend from a first surface 288 of the right substrate 284.

The middle substrates 292 and the thermoelectric layers 290 are comparable to the top and bottom substrates and thermoelectric layers of the previously described devices. Each middle substrate 292 has a first surface 296 and an opposing second surface 298. A plurality of first contacts 300 is deposited on the second surface 298 of each middle substrate 292, except with respect to the bottom middle substrate 292. A plurality of second contacts 302 is deposited on the first surface 296 of each middle substrate 292, except with respect to the top middle substrate 292.

Scaffold members 304 are deposited between corresponding middle substrates 292. As in the previous embodiments, each scaffold member 304 includes a plurality of cavities 310 and n-type and p-type thermoelectric materials 306, 308 are respectively deposited within alternate cavities 310. Similar to thermoelectric device 10 of FIG. 1, thermoelectric materials 306, 308 of thermoelectric device 280 may coat the sidewalls 312 of respective cavities 310. Alternatively, similar to thermoelectric device 80 of FIG. 3, thermoelectric device 280 may include thermoelectric materials 306, 308 that form solid thermoelectric blocks. Similar to FIGS. 4 and 5, the nature of the thermoelectric materials 306, 308 is visually indeterminable in the present prospective view.

FIGS. 7A-7F illustrate an exemplary method for fabricating the thermoelectric device 120 illustrated in FIG. 4. It is understood, however, that similar methods may be used for fabrication of the other thermoelectric devices described herein.

First, as illustrated in FIG. 7A, recesses 250 are etched into a bottom substrate 124. Second, as illustrated in FIG. 7B, routing metal is deposited into the etched recesses 250 to from the bottom contacts 134 (i.e., electrical connections). The routing metal 124 has a good contact resistant to the thermoelectric materials 128, 130. For example, the routing metal 134 comprises gold (Au); nickel (Ni); copper (Cu); eutectic metal combinations such as Au—Sn, Au—In, Sn—Ag—Cu, Pb—Sn; or combinations thereof.

Third, as illustrated in FIG. 7C, the scaffold member 126 is deposited onto the first surface 138 of the bottom substrate 124. When the scaffold member comprises glass or fused silica, the scaffold member 126 is vacuum bonded to the bottom substrate 124. When the scaffold member comprises polyimide, the scaffold member 126 is directly deposited, or spun. Fourth, as illustrated in FIG. 7D, the scaffold member 126 is etched and cavities 150 formed. When the scaffold member 126 comprises glass or fused silica, the scaffold member 126 is etched using reactive ion or wet etching. The scaffold member 126 is etched after selective exposure to light when the scaffold member comprises reactive polymers or dry etched (reactive ion etching ("RIE") or deep reaction ion etching ("DRIE")) when comprised of phot-inert polymers.

Fifth, as illustrated in FIG. 7E, thermoelectric materials 128, 130 are deposited within the cavities 150. In certain instances, as seen in FIG. 1, the thermoelectric materials 128, 130 may be deposited along sidewalls of the cavities 150. In other instances, as seen in FIG. 3, the thermoelectric materials 128, 130 are deposition within the cavities 150 to form a solid thermoelectric blocks. FIGS. 8-10, described below, illustrate particular methods of depositing the thermoelectric materials 128, 130. Generally, thin film deposition techniques are used. For example, physical vapor deposition ("PVD") techniques, including evaporation, sputtering, and pulsed laser may be used.

Once the thermoelectric materials 128, 130 are deposited, the scaffold member 126 connects the deposited thermoelectric legs 140 in a serial manner. The high density patterning of the scaffold member 126 results in a high density of thermoelectric legs 140. For example, the thermoelectric device may have a density of ranging between 10 and 1000 thermoelectric legs per $mm^2$. The connection in series of the high density thermoelectric legs 140 allow for the generation of large voltages with small temperature gradients. Further, the scaffold member 126 allows the length (seen as height in the present image) of the thermoelectric materials 128, 130 to be increased because the length is no longer limited by the thickness of the film. The length of the thermoelectric materials 128, 130 instead is dependent upon the depth of the scaffold member 126 and not the thickness of the thermoelectric material 128, 130 deposited. As a result, thermal resistance is independent of the film's thickness, which allows high thermal resistance to be achieved.

Sixth, as illustrated in FIG. 7F, top contacts 136 are deposited on the first ends 144 (e.g., top surface, exposed ends) of each thermoelectric material 128, 130. Lastly, though not shown, a top substrate is deposited opposing the bottom substrate 124. Similar to the bottom substrate 124 of FIGS. 7A and 7B, recesses may be etched and routing metals deposited in the top substrate.

As referenced above, FIGS. 8-10 illustrate exemplary methods for deposition of thermoelectric materials 128, 130 onto the scaffold member 126. Material type, desired film thickness (fill factor), and ease of manufacturing are considered when selecting a deposition method.

FIG. 8 illustrates a direct sputtering method 198 for depositing the thermoelectric materials 128, 130 (collectively the thermoelectric film 200) onto the scaffold member 126. In such instances, the thermoelectric materials 128, 130 are directly sputtered onto the sidewalls 152 using a high-pressure process. The deposited thermoelectric materials 128, 130 may have a thickness of greater than 10 μm. The deposited thermoelectric material 128, 130 has a combination of in-plane and out-of-plane properties. The thermoelectric materials 128, 130 may be directly sputtered via magnetron to form the conformal thermoelectric coating (i.e., film) 200. In certain instances, multiple sputtering steps may be used to deposit the thermoelectric materials 128, 130. The multiple sputtering steps may allow for the formation of superlattices and quantum wells, which improve the performance of the thermoelectric coating 200. Superlattices may increase the thermal resistivity by increasing phonon scattering at the interfaces. Quantum wells may enhance the Seebeck effect. The use of multiple sputtering steps may also reduce the stress held by the deposited thermoelectric coating (i.e., film) 200.

FIGS. 9A-9B illustrates an angled evaporation method for depositing the thermoelectric materials 128, 130 (collectively the thermoelectric film 200) onto the scaffold member 126. The evaporation method may be used to deposit tellurium based thermoelectric materials. The thermoelectric material 128, 130 deposited using the evaporation method may have a moderate thickness ranging between 2 μm and 10 μm.

During the evaporation process, the scaffold member 126 is alternated between first and second angles 214, 216 relative to the source. As seen, the scaffold member 126 may be angled relative to the source. However, in other instances, the source may be angled relative to the scaffold member 126. The repositioning of the scaffold member 126 ensures consistent coating of all sidewalls 152 of the cavity 150. For example, if coating of all sidewalls 152 is desired, the scaffold member 126 may be angle relative to the source and constantly rotated to complete a full 360 degree turn. In other instances, the scaffold member 126 may be rotated in increments of 90 degree to coat each desired wall. The properties of the thermoelectric film 200 depend upon the particular angle of deposition. In certain aspects, the smaller the angle of the source relative to the scaffold member 126 the closer the properties of the thermoelectric film 200 will be to out-of-plane.

FIG. 9A illustrates the scaffold member 126 mounted at a first angle 214 relative to a source. In such instances, the thermoelectric material 128, 130 is thermally evaporated onto the first sidewall 152A. FIG. 9B illustrates the scaffold member 126 mounted at a second angle 216 relative to the source. In such instances, the thermoelectric material 128, 130 is thermally evaporated onto the second sidewall 152B. The flow of thermoelectric material 128, 130 in each instance is illustrated by arrows 224.

FIGS. 10A-10B illustrates a hard press (i.e., sintering) method for depositing thermoelectric materials 128, 130 (collectively the thermoelectric film 200) onto the scaffold member 126. Generally, the thermoelectric materials 128, 130 are pressed into alternate cavities 150 to form solid bodies. First, as illustrated in FIG. 10A, powder thermoelectric materials 200 are placed within respective cavities 150. The powder thermoelectric materials 128, 130 are deposited until the respective cavities 150 are filled to full capacity. Second, as illustrated by FIG. 10B, heat and pressure 236 is applied in an inert environment comprising argon (Ar) or nitrogen (N) and a pressure plate 242 presses and sinters the powered thermoelectric material 128, 130 into a solid thermoelectric block 202. For example, the thermoelectric materials 200 may be heated to 450° C. and a pressure greater than 2.5 GPa applied. Arrows 244 represent the direction of force applied by the pressure plate 242. In certain aspects, the thermoelectric film 200 formed using a hard press method may have out-of-plane properties.

FIG. 11 illustrates an exemplary thermoelectric device 470 similar to the thermoelectric devices described above except the sidewalls of the cavities are substantially parallel. Similar to the previous embodiments, the thermoelectric device 470 comprises a top substrate 472 opposing a bottom substrate 474; a plurality of top and bottom contacts 476, 478 deposited on first surfaces 480, 482 of the top and bottom substrates 472, 474, respectively; a scaffold member 490 sandwiched by the top and bottom substrates 472, 474; and a plurality of alternating n-type and p-type thermoelectric materials 486, 488 deposited onto the scaffold member 490.

The scaffold member 490 forms a plurality of pillars 494 and valleys (i.e., cavities) 492 therebetween. In certain instances, the pillars 494 may be rectangular. The pillars 494 may have a height ranging from 10 μm to 500 μm. For example, the pillars 494 may have a height between 20 μm and 200 μm. The pillars 494 may have a thickness of 2 μm. The pillars 494 include a first sidewall 496 opposing a second sidewall 498. The first sidewalls 496 of the pillars 494 face a first direction. The second sidewalls 498 of the pillars 494 face a second direction that directly opposes the first direction. The first and second sidewalls 496, 498 are substantially parallel. The pillars 494 forming the plurality are substantially parallel with each other. For example, a first pillar 494 of the plurality may be substantially parallel with a second pillar 494 of the plurality. Further, the second pillar 494 may substantially parallel with a third pillar 494.

Similarly to the previous embodiments, the sidewalls 496, 498 are substantially vertical with respect to the bottom substrate 472. For example only, the sidewalls 496, 498 may be substantially ninety-degrees vertical with respect to the bottom substrate 472. The sidewalls 496, 498 of the pillar 494 may be perpendicular with respect to the bottom substrate 472. The thermoelectric materials 486, 488 are deposited on opposing sidewalls 496, 498. The n-type thermoelectric material 486 is deposited on the first sidewall 496 of each pillar. The p-type thermoelectric material 488 is deposited on the second sidewall 498 of each pillar. As such, the scaffold member 490 provides a near vertical substrate upon which thermoelectric materials 486, 488 are deposited.

Bottom contacts 478 align with the valleys 492. A composition of the n-type and p-type thermoelectric materials 486, 488 forms a connecting thermoelectric film 484 that is deposited on top of the bottom contacts 478 and a top surface 506 of each pillar 494. The connecting thermoelectric films 484 may have a thickness of 5 μm. Top contacts 476 align with the connecting thermoelectric film 484 deposited on the top surfaces 506 of the pillars 494 and serves as bonding layer for the top substrate 472. The connecting thermoelectric film 484 and the top and bottom contacts 476, 478 form parallel electrical path links between the n-type and p-type thermoelectric materials 486, 488. The top and bottom contacts 476, 478 also reduce the resistance of the connection between thermoelectric legs.

It is recognized that in certain instances, the top substrate may have a similar pillar structure as the bottom substrate. In such instances, pillars extending from the top substrate may interlock with pillars extending from the bottom substrate. FIG. 12 illustrates an exemplary thermoelectric device 508 similar to thermoelectric device 470 illustrate in FIG. 11 except the top substrate includes a plurality of pillars that interlock with the pillars of the bottom substrate and the n-type and p-type thermoelectric materials are deposited on the alternating pillars of the top and bottom substrate.

The thermoelectric device 508 comprises a top substrate 510 opposing a bottom substrate 512. A plurality of top pillars 518 are deposited on a first surface 514 of the top substrate 510. A plurality of bottom pillars 520 are deposited on a first surface 516 of the bottom substrate 512. The top pillars 518 interlock with the bottom pillars 520 forming an interlocking pattern. N-type thermoelectric materials 522 coat the top pillars 518. P-type thermoelectric material 524 coats the bottom pillars 520. Top contacts 532 are deposited on the first surface 514 of the top substrate 510 and align with a distal end 526 of the top pillars 518. Bottom contacts 530 are deposited on the first surface 516 of the bottom substrate 512 and align with a distal end 528 of the bottom pillars 520.

FIG. 13 illustrates an exemplary thermoelectric device 320 similar to thermoelectric device 470 illustrated in FIG. 11 except the pillars are formed from a bottom substrate comprised of silicon (Si) and a composition of the n-type and p-type thermoelectric materials serves as the top and bottom contacts.

The thermoelectric device 320 comprises a top substrate 322 opposing a bottom substrate 324 formed of silicon (Si). A first surface 328 of the bottom substrate 324 is etched to form a scaffold including a plurality of pillars 332. Similar to FIG. 11, the pillars 332 include a first sidewall 338 opposing a second sidewall 340. The sidewalls 338, 340 are substantially parallel and ninety-degrees vertical with respect to the top and bottom substrates 322, 324. The pillars 332, and consequentially the first surface 328 of the bottom substrate 324, are oxidized using wet oxidation in a furnace. The pillars 332 are oxidized substantially throughout. The pillars may be fully oxidized so that no elemental silicon remains.

N-type and p-type thermoelectric materials 334, 336 are respectively deposited on the oxidized sidewalls 338, 340. A composite of the n-type and p-type thermoelectric materials 486, 488 forms a connecting thermoelectric film 346. The connecting thermoelectric film 370 is deposited on the top surfaces 354 of the oxidized pillars 332 and on the oxidized first surface 328 of the bottom substrate 324 between the pillars 332. The connecting thermoelectric films 370 electrically connect the thermoelectric members 334, 336 to one another and the thermoelectric leg pairs to one another. The connecting thermoelectric films 370 may be supplemented with later deposited metal.

FIG. 14 illustrates an exemplary thermoelectric device 360 similar to thermoelectric device 320 illustrated in FIG. 13 except thermoelectric materials are also deposited on the first surface of the bottom substrate. Thermoelectric device 360 comprises a top substrate 376 opposing a bottom substrate 378 and a plurality of oxidized pillars 364 extending from a first surface 382 of the bottom substrate 378 and having opposing first and second sidewalls 384, 386.

Thermoelectric materials 366, 368 are deposited on the sidewalls 384, 386 of each pillar 364 and on the first surface 382 of the bottom substrate 378. The first surface 382 of the bottom substrate 378 is segmented into portions. The bottom substrate 378 includes a first portion 392 adjacent to the first side of each pillar 364; a second portion 394 adjacent to the second side of each pillar 364; and a third portion 396 therebetween. N-type thermoelectric material 366 is deposited on the first sidewall 384 of each pillar 364 and on the first portions 392 of the bottom substrate 378. P-type thermoelectric material 368 is deposited on the second sidewall 386 of each pillar 364 and on the second portions 394 of the bottom substrate 378. A composite 370 of the n-type and p-type thermoelectric materials 366, 368 is deposited on the third portion 396 of the bottom substrate 378 and on the top surfaces 374 of the oxidized pillars 332.

Physical separation of the n-type and p-type thermoelectric materials 366, 368 results from a shadowing effect of the pillars 364 (described below). The first sidewalls 384 upon which the n-type thermoelectric material 366 is deposited are the first members of respective thermoelectric leg pairs, and the second sidewalls 386 upon which the p-type thermoelectric material 368 is deposited are the second members of respective thermoelectric leg pairs. The first and second members (i.e., the first and second legs of the leg pair) are connected by the composite 370 of the n-type and p-type thermoelectric materials 366, 368.

FIGS. 15A-15E illustrates an exemplary method for fabricating the thermoelectric device 360 illustrated in FIG. 14. It is understood, however, that similar methods may be used for fabrication of the other thermoelectric devices described above.

FIG. 15A depicts the starting bottom substrate 378. First, as illustrated in FIG. 15B, the bottom substrate 378 is etched, or patterned to form the scaffolding, including the plurality pillars 364 extending from the first surface 382 of the bottom substrate 378. The bottom substrate 378 may be patterned using dry etching. Second, as illustrated in FIG. 15C, the pillars 364 are oxidized. As a result the oxidation of the pillars 364, the first surface 382 of the bottom substrate 378 is also oxidized.

Third, as illustrated in FIG. 15D, a second source 428 deposits the p-type thermoelectric material 368 onto the second sidewalls 386. The second source 428 also deposits the p-type thermoelectric materials 368 onto the second and third portions 394, 396 of the bottom substrate 378. The second source 428 may be positioned at an angle between 30 and 60 degrees relative to the second sidewalls 386. Shadows 430 are casted by the pillars 364 relative to the second source 428. The shadows 430 define the deposition area and causes p-type thermoelectric material 368 not to be deposited onto the first sidewalls 384 or corresponding first portions 392. The area of deposition for the p-type thermoelectric material 368 is illustrated by cone 434.

Fourth, as illustrated in FIG. 15E, a first source 436 deposits the n-type thermoelectric material 366 onto the first sidewall 384 of each pillar 364. The first source 436 also deposits the n-type thermoelectric materials 366 onto the first and third portions 392, 396 of the bottom substrate 378. The first source 436 may be positioned at an angle between 30 and 60 degrees relative to the first sidewalls 384. Shadows 438 are casted by the pillars 364 relative to the first source 436. The shadows 438 define the deposition area and causes n-type thermoelectric material 366 not to be deposited onto the second sidewalls 386 or corresponding second portions 394. The area of deposition for the first thermoelectric material 366 is illustrated by cone 440.

Both the first source 436 and second source 428 deposits the thermoelectric materials 366, 368 in an anisotropic fashion by line-of-sight thermal evaporation. Both thermoelectric materials 366, 368 are deposited on the third portion 396 of the bottom substrate 378. Thus, the third portion 396 of the bottom substrate 378 is defined by the overlap of deposition cones 434 and 440. The composite of the two thermoelectric materials 366, 368 forms the connecting thermoelectric film 370. As seen in FIG. 16, other shadow masks 442 of various sizes and shapes may be used in either instance (deposition of the first or second thermoelectric material 366, 368) to alter the shadow 446 casted and the corresponding deposition cones 448.

In certain instances, as seen in FIGS. 15A-15E, the thermoelectric materials 366, 368 are deposited at separate times. In other instances, as seen in FIG. 17, the thermoelectric materials 366, 368 are deposited simultaneously. Simultaneous deposition of the thermoelectric materials 366, 368 is possible because of the shadowing effect of the pillars 364 and the resulting physically separate of the first and second thermoelectric materials 366, 368.

FIGS. 18A-18E provide another illustration of the exemplary method of FIGS. 15A-15E. First, as illustrated in FIG. 18A, the bottom substrate 378 is etched. Second, as illustrated in FIG. 18B, the pillars 364 are oxidized. The first surface 382 of the bottom substrate 378 is also oxidized, but as a result of the oxidation of the pillars 364. Third, as illustrated in FIG. 18C, metal patterning 462 of the bottom substrate 378 occurs. The deposited metal 462 may form electrical terminals and connect columns 540. Separating the thermoelectric films into the multiple columns 540 increases the leg density and the output voltage, which is needed for low temperature application. Fourth, as illustrated in FIG. 18D, the thermoelectric materials 366, 368 are deposited. Lastly, as illustrated in FIG. 18E, the top substrate 376 is deposited.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of fabricating a high-aspect thermoelectric device, the method comprising:
    forming a plurality of pillars on a first substrate, where the plurality of pillars extending upwardly from a first surface of the first substrate, each pillar defining a first sidewall and a second sidewall, wherein the first sidewalls of the pillars face a first direction, the second sidewalls of the pillars face a second direction opposing the first direction;
    oxidizing the pillars;
    depositing a first thermoelectric material onto the first sidewall of each oxidized pillar from a first source; and
    depositing a second thermoelectric material onto the second sidewall of each oxidized pillar from a second source.

2. The method of claim 1, wherein the first substrate comprises silicon and the pillars are oxidized such that no elemental silicon remains.

3. The method of claim 1, wherein the depositing of the first thermoelectric material and the depositing of the second thermoelectric material occurs simultaneously.

4. The method of claim 1, wherein the depositing of the second thermoelectric material occurs after the depositing of the first thermoelectric material.

5. The method of claim 4, further comprising:
    moving the first substrate from a first position and second position, wherein the first substrate is at the first position during the depositing of the first thermoelectric material and the first substrate is at the second position during the deposition of the second thermoelectric material.

6. The method of claim 1, wherein the first source is positioned at a first angle relative to the first substrate, and the second source is positioned at a second angle relative to the first substrate.

7. The method of claim 1, further comprising:
    depositing the first thermoelectric material on one or more first areas of the first substrate, wherein the one or more first areas are immediately adjacent to the first sidewalls of the oxidized pillars; and
    depositing the second thermoelectric material on one or more second areas of the first substrate, wherein the one or more second areas are immediately adjacent to the second sidewalls of the oxidized pillars.

8. The method of claim 7, wherein the first areas and the second areas overlap to form third areas of the first substrate whereon a thermoelectric composite of the first and second thermoelectric materials is deposited.

9. The method of claim 8, wherein the thermoelectric composite forms electrical contacts.

10. The method of claim 7, wherein the first, second, and third areas of the first substrate are defined by shadow masks deposited on exposed ends of each pillar prior to deposition of the first and second thermoelectric materials.

11. The method of claim 1, wherein the first thermoelectric material is a n-type thermoelectric material selected from the group consisting of: bismuth telluride ($Bi_2Te_3$), bismuth selenide ($Bi_2Se_3$), gallium nitride (GaN), lead telluride (PbTe), cobalt antimonide ($CoSb_3$), lanthanum telluride (LaTe), bismuth telluride selenide ($Bi_2Te_{(3-x)}Se_x$, wherein x ranges from 0.1 to 1), and combinations thereof; and the second thermoelectric material is a p-type thermoelectric material selected from the group consisting of: antimony telluride ($Sb_2Te_3$), bismuth antimony telluride ($Sb_3BiTe_6$), lead telluride (PbTe), lead tellurium selenide ($Pb_2SeTe$), silicon germanium (SiGe), $(GeTe)_x(AgSbTe_2)_y$, (wherein x ranges from 70 to 75 and y equals 100−x), and combinations thereof.

12. The method of claim 1, wherein the pillars each have a height ranging from 10 μm to 100 μm.

13. The method of claim 1, wherein the pillars are separated from each another by a distance ranging from 10 μm to 100 μm.

14. The method of claim 1, wherein a first surface of the first substrate is also oxidized and the method further comprises:

depositing one or more metal patterns on the first surface of the first substrate.

15. The method of claim 1, further comprising:

etching a first surface of a base substrate to form a plurality of recesses;

depositing one or more metals into each recess; and depositing the first substrate onto the first surface of the base substrate.

16. The method of claim 1, further comprising:

bonding a second substrate onto the first substrate and thereby sandwiching the thermoelectric material between the first substrate and the second substrate, wherein a first surface of the second substrate faces the first surface of the first substrate.

17. The method of claim 1 wherein the plurality of pillars are formed of a polymer material.

18. A method of fabricating a high-aspect thermoelectric device, the method comprising:

etching a first surface of a base substrate to form a plurality of recesses;

depositing one or more metals into each recess;

depositing a silicon substrate onto the first surface of the base substrate;

etching the silicon substrate to form a plurality of pillars extending upwardly from a first surface of the silicon substrate, each pillar defining a first sidewall and a second sidewall, wherein the first sidewalls of the pillars face a first direction, the second sidewalls of the pillars face a second direction opposing the first direction, the first sidewall and the second sidewall of each pillar are substantially parallel, and pillars in the plurality of pillars are substantially parallel with each other;

oxidizing the pillars such that no elemental silicon remains;

depositing a first thermoelectric material onto the first sidewall of each oxidized pillar from a first source;

depositing a second thermoelectric material onto the second sidewall of each oxidized pillar from a second source; and bonding a second substrate onto the first substrate and thereby sandwiching the thermoelectric material between the first substrate and the second substrate, wherein a first surface of the second substrate faces the first surface of the first substrate.

19. The method of claim 18, wherein the first thermoelectric material is a n-type thermoelectric material selected from the group consisting of: bismuth telluride ($Bi_2Te_3$), bismuth selenide ($Bi_2Se_3$), gallium nitride (GaN), lead telluride (PbTe), cobalt antimonide ($CoSb_3$), lanthanum telluride (LaTe), bismuth telluride selenide ($Bi_2Te_{(3-x)}Se_x$, wherein x ranges from 0.1 to 1), and combinations thereof; and the second thermoelectric material is a p-type thermoelectric material selected from the group consisting of: antimony telluride ($Sb_2Te_3$), bismuth antimony telluride ($Sb_3BiTe_6$), lead telluride (PbTe), lead tellurium selenide ($Pb_2SeTe$), silicon germanium (SiGe), $(GeTe)_x(AgSbTe_2)_y$, (wherein x ranges from 70 to 75 and y equals 100−x), and combinations thereof.

20. The method of claim 18, further comprising:

moving the first substrate from a first position and second position, wherein the first substrate is at the first position during the depositing of the first thermoelectric material and the first substrate is at the second position during the deposition of the second thermoelectric material.

21. The method of claim 18, wherein the first source is positioned at a first angle relative to the first substrate, and the second source is positioned at a second angle relative to the first substrate.

* * * * *

UNITED STATES PATENT AND TRADEMARK OFFICE
CERTIFICATE OF CORRECTION

| | |
|---|---|
| PATENT NO. | : 11,678,578 B2 |
| APPLICATION NO. | : 17/164002 |
| DATED | : June 13, 2023 |
| INVENTOR(S) | : Khalil Najafi et al. |

It is certified that error appears in the above-identified patent and that said Letters Patent is hereby corrected as shown below:

In the Claims

At Column 18, Claim number 10, Line number 64, delete "claim 7," and insert --claim 8,--.

At Column 19, Claim number 11, Line number 6, delete "$(Bi_2Te_{(3-x)})Se_{x1}$" and insert --$(Bi_2Te_{(3-x)}Se_{x1}$--.

Signed and Sealed this
Eighth Day of August, 2023

*Katherine Kelly Vidal*

Katherine Kelly Vidal
*Director of the United States Patent and Trademark Office*